United States Patent
Iwashita et al.

(10) Patent No.: US 7,820,360 B2
(45) Date of Patent: Oct. 26, 2010

(54) POLYMER COMPOUND, NEGATIVE RESIST COMPOSITION, AND METHOD OF FORMING RESIST PATTERN

(75) Inventors: Jun Iwashita, Kawasaki (JP); Ayako Kusaka, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 29 days.

(21) Appl. No.: 12/065,990

(22) PCT Filed: Aug. 17, 2006

(86) PCT No.: PCT/JP2006/316160
§ 371 (c)(1), (2), (4) Date: Mar. 6, 2008

(87) PCT Pub. No.: WO2007/029462
PCT Pub. Date: Mar. 15, 2007

(65) Prior Publication Data
US 2009/0162785 A1    Jun. 25, 2009

(30) Foreign Application Priority Data
Sep. 9, 2005    (JP) .............................. 2005-261848

(51) Int. Cl.
G03F 7/00    (2006.01)
G03F 7/004    (2006.01)
C07C 69/52    (2006.01)

(52) U.S. Cl. .................... 430/270.1; 430/311; 430/913; 430/914; 430/927; 430/945; 560/220; 526/72

(58) Field of Classification Search ............... 430/311, 430/270.1, 913, 945, 927, 914; 560/220; 526/72
See application file for complete search history.

(56) References Cited

U.S. PATENT DOCUMENTS

| | | | |
|---|---|---|---|
| 5,204,225 A | 4/1993 | Feely | |
| 5,945,517 A | 8/1999 | Nitta et al. | |
| 6,180,313 B1 | 1/2001 | Yukawa et al. | |
| 6,306,555 B1* | 10/2001 | Schulz et al. | 430/270.1 |
| 6,806,026 B2* | 10/2004 | Allen et al. | 430/270.1 |
| 6,846,609 B2* | 1/2005 | Uetani et al. | 430/270.1 |
| 7,183,368 B2 | 2/2007 | Hada et al. | |
| 7,402,712 B2* | 7/2008 | Hatakeyama et al. | 568/665 |
| 7,528,279 B2* | 5/2009 | Hatakeyama et al. | 560/220 |
| 2007/0129532 A1 | 6/2007 | Hatakeyama et al. | |
| 2009/0099326 A1* | 4/2009 | Okada et al. | 526/242 |
| 2009/0149665 A1* | 6/2009 | Okada et al. | 549/511 |

FOREIGN PATENT DOCUMENTS

| | | |
|---|---|---|
| EP | 1 557 718 A1 | 7/2005 |
| JP | H08-3635 | 1/1996 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2000-206694 | 7/2000 |
| JP | 2000-275843 | 10/2000 |
| JP | 2004-029053 | 1/2004 |
| JP | 2004-272227 | 9/2004 |
| JP | A-2005-003863 | 1/2005 |
| JP | 2005-43852 | 2/2005 |
| JP | 2005-208527 | 8/2005 |
| JP | 2005220066 A * | 8/2005 |
| JP | 2007055966 A * | 3/2007 |
| JP | 2007131582 A * | 5/2007 |
| TW | 200421024 A | 10/2004 |
| WO | WO 2004/074242 A2 | 9/2004 |
| WO | WO 2005/075406 A1 | 8/2005 |

OTHER PUBLICATIONS

Machine translation of JP 2005-220066A (2007).*
International Search Report in connection with corresponding PCT application No. PCT/JP2006/316160, Oct. 10, 2006.

(Continued)

*Primary Examiner*—Amanda C. Walke
(74) *Attorney, Agent, or Firm*—Knobbe, Martens, Olson & Bear, LLP

(57) ABSTRACT

There are provided a polymer compound which can form a resist pattern with excellent resolution, and a negative resist composition containing the polymer compound and a resist pattern-forming method thereof.

The present invention is a polymer compound containing a structural unit (a0) represented by a general formula (a0-1) shown below.

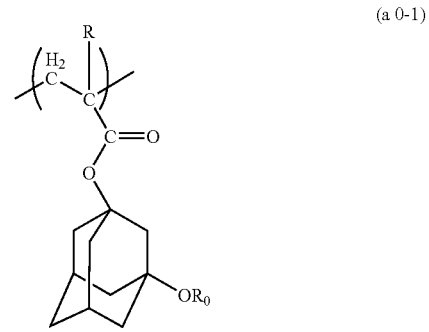

(a 0-1)

(wherein, R represents a hydrogen atom, a halogen atom, an alkyl group or a halogenated alkyl group; and $R_0$ represents an alkyl group containing a hydroxyl group.)

Also, the present invention is a negative resist composition, including: an alkali soluble resin component (A), an acid generator component (B) that generates acid upon exposure, and a cross-linking agent (C), wherein the alkali soluble resin component (A) contains a polymer compound (A1) having a structural unit (a0) represented by the general formula (a0-1) shown above.

8 Claims, No Drawings

OTHER PUBLICATIONS

Tsuchiya et al., *Investigation of Acid-Catalyzed Insolubilization Reactions for Alicyclic Polymers with Carboxyl Groups,* Journal of Photopolymer Science and Technology, vol. 10 No. 4, pp. 579-584 (1997).

Maeda et al., *ArF Chemically Amplified Negative Resist Using Alicyclic Epoxy Polymer,* Journal of Photopolymer Science and Technology, vol. 11 No. 3, pp. 507-512 (1998).

Iwasa et al., *Novel Negative Photoresist Based on Polar Alicyclic Polymers for ArF Excimer Laser Lithography,* SPIE Advances in Resist Technology and Processing XIV, vol. 3333, pp. 417-424 (1998).

Conley et al., *Negative Photoresist for 157 nm Microlithography; A Progress Report,* SPIE Advances in Resist Technology and Processing XIX, vol. 4690, pp. 94-100 (2002).

Office Action issued on counterpart Taiwanese Patent Application No. 095130685, dated Oct. 16, 2009.

An Office Action issued on counterpart Taiwanese Patent Application No. 095130685, dated Jul. 12, 2010.

* cited by examiner

POLYMER COMPOUND, NEGATIVE RESIST COMPOSITION, AND METHOD OF FORMING RESIST PATTERN

RELATED APPLICATIONS

This application is the U.S. National Phase filing under 35 U.S.C. §371 of PCT/JP2006/316160, filed Aug. 17, 2006, which designated the U.S. and was published in a language other than English, which claims priority under 35 U.S.C. §119(a)-(d) to Japanese Patent Application No. 2005-261848, filed Sep. 9, 2005. The contents of these applications are incorporated herein by reference in their entireties.

TECHNICAL FIELD

The present invention relates to a polymer compound, a negative resist composition, and a method of forming a resist pattern.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and a developing treatment is then conducted, thereby forming a resist pattern of the prescribed shape in the resist film. Resist materials in which the exposed portions change to become soluble in the developing liquid are termed positive materials, whereas resist materials in which the exposed portions change to become insoluble in the developing liquid are termed negative materials.

In recent years, in the production of semiconductor elements and liquid crystal display elements, advances in lithography techniques have lead to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use $F_2$ excimer lasers, electron beams EB), extreme ultraviolet radiation (EUV) and X-rays.

Conventionally, as the negative resist compositions used for processes that employ i-line radiation or a KrF excimer laser (248 nm) as the light source, negative resist compositions including a combination of an acid generator, an alkali soluble resin such as a novolak resin or a polyhydroxystyrene, and an amino-based resin such as a melamine resin or a urea resin have been used (for example, see patent reference 1).

Moreover, as negative resist materials for a process using an ArF excimer laser with a shorter wavelength, negative resist compositions including a resin component containing a carboxyl group, a cross-linking agent containing an alcoholic hydroxyl group, and an acid generator have been proposed as those wherein transparency to an ArF excimer laser can be improved. These compositions are of a type wherein the action of the acid generated by the acid generator causes a reaction between the carboxyl group of the resin component and the alcoholic hydroxyl group of the cross-linking agent, thus altering the resin component from an alkali soluble state to an alkali insoluble state.

Furthermore, a negative resist composition including a resin component containing a carboxyl group or a carboxylate ester group together with an alcoholic hydroxyl group, and an acid generator, wherein the carboxyl group or the carboxylate ester group, and the alcoholic hydroxyl group within the resin component undergo an intermolecular reaction under the action of the acid generated by the acid generator, thus altering the resin component from an alkali soluble state to an alkali insoluble state, has also been proposed (for example, see non-patent references 1 to 3 and patent reference 2).

[Patent Reference 1]
Japanese Unexamined Patent Application, First Publication No. Hei8-3635

[Patent Reference 2]
Japanese Unexamined Patent Application, First Publication No. 2000-206694

[Non-Patent Reference 1]
Journal of Photopolymer Science and Technology, Vol. 10, No. 4, pp. 579 to 584, published in 1997

[Non-Patent Reference 2]
Journal of Photopolymer Science and Technology, Vol. 11, No. 3, pp. 507 to 512, published in 1998

[Non-Patent Reference 3]
SPIE Advances in Resist Technology and Processing XIV, Vol. 3333, pp. 417 to 424, published in 1998

[Non-Patent Reference 4]
SPIE Advances in Resist Technology and Processing XIX, Vol. 4690, pp. 94 to 100, published in 2002

DISCLOSURE OF THE INVENTION

Problems to be Solved by the Invention

However, in the case of forming a resist pattern on a substrate using a conventional negative resist composition described above, the resist pattern thus formed has a problem in resolution, for example, due to footing.

The present invention takes the above circumstances into consideration, with an object of providing a polymer compound which can form a resist pattern with excellent resolution, and providing a negative resist composition containing the polymer compound and a resist pattern-forming method thereof.

Means for Solving the Problems

To achieve the above object, the present invention employs the following constitutions.

A first aspect of the present invention represents a polymer compound including a structural unit (a0) represented by a general formula (a0-1) shown below.

[Formula 1]

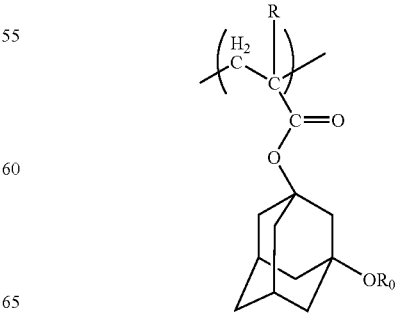

(a 0-1)

(wherein, R represents a hydrogen atom, a halogen atom, an alkyl group or a halogenated alkyl group; and $R_0$ represents an alkyl group containing a hydroxyl group.)

A second aspect of the present invention represents a negative resist composition, including an alkali soluble resin component (A), an acid generator component (B) that generates an acid upon exposure, and a cross-linking agent (C), wherein the alkali soluble resin component (A) contains a polymer compound (A1) having the structural unit (a0) represented by the general formula (A0-1).

A third aspect of the present invention represents a resist pattern-forming method, including the steps of forming a resist film on a substrate using the negative resist composition according to the second aspect, exposing the resist film, and developing the resist film to form a resist pattern.

Here, the term "structural unit" refers to a monomer unit that contributes to the formation of a resin component (polymer compound).

The term "acrylic acid" is a concept containing an acrylic acid ($CH_2=CH-COOH$) in which a hydrogen atom is bonded with a carbon atom at the α-position, an α-substituted acrylic acid in which a hydrogen bonded with a carbon atom at the α-position is substituted with another substituent group, and a derivative of acrylic acid such as an acrylate ester described below. Examples of "another substituent group" include a halogen atom such as a fluorine atom, an alkyl group, and a halogenated alkyl group such as a fluorinated alkyl group.

The term "acrylate ester" is a concept containing an acrylate ester in which a hydrogen atom is bonded with a carbon atom at the α-position, and an α-substituted acrylate ester in which a hydrogen bonded with a carbon atom at the α-position is substituted with another substituent group. Examples of the substituent group include a halogen atom such as a fluorine atom, an alkyl group, and a halogenated alkyl group such as a fluorinated alkyl group.

Here, in "acrylic acid" and "acrylate ester", "α-position (a carbon atom at the α-position)" represent a carbon atom bonded with a carbonyl group, unless another specific definition is provided.

The term "structural unit derived from an acrylic acid" represents a structural unit that is formed by the cleavage of the ethylenic double bond of an acrylic acid.

The term "structural unit derived from an acrylate ester" represents a structural unit that is formed by the cleavage of the ethylenic double bond of an acrylate ester.

The term "alkyl group" is a concept containing a linear, branched and cyclic monovalent saturated hydrocarbon group, unless another definition is particularly provided.

The term "lower alkyl group" represents an alkyl group of 1 to 5 carbon atoms.

The term "exposure" is used as a general concept containing irradiation with any form of radiation such as an electron beam.

EFFECTS OF THE INVENTION

According to the polymer compound, the negative resist composition including the polymer compound, and the resist pattern-forming method of the present invention, it is possible to form a resist pattern with excellent resolution.

BEST MODE FOR CARRYING OUT THE INVENTION

>>Polymer Compound>>

The polymer compound of the present invention contains a structural unit (a0) represented by the general formula (a0-1).

Also, it is preferable that the polymer compound of the present invention further includes a structural unit (a1) which has an aliphatic cyclic group (alicyclic group) containing a fluorinated hydroxyl allyl group.

Also, it is preferable that the polymer compound of the present invention further includes a structural unit (a2) which is derived from an acrylate ester containing a hydroxyl group-containing chain-like alkyl group.

Structural Unit (a0)

The structural unit (a0) is a structural unit represented by the general formula (a0-1). By containing the structural unit (a0), the effect of the present invention can be acquired.

The structural unit (a0) is a structural unit in which an alkyl group containing a hydroxyl group is bonded with the 3-position of an adamantyl group through an ester bond.

In the general formula (a-1), R represents a hydrogen atom, a halogen atom, an alkyl group or a halogenated alkyl group. The halogen atom, the alkyl group or the halogenated alkyl group of R is the same as the halogen atom, the alkyl group or the halogenated alkyl group which may be bonded with the α-position of acrylate ester described above.

Examples of the halogen atom of R include a fluorine atom, a chlorine atom and an iodine atom. Of these, a fluorine atom is particularly preferable.

The alkyl group of R is preferably a lower alkyl group of 5 or less carbon atoms. Examples thereof include a methyl group, ethyl group, propyl group, isopropyl group, n-butyl group, isobutyl group, tert-butyl group, pentyl group, isopentyl group and neopentyl group. Of these, a methyl group is preferable.

The halogenated alkyl group of R is preferably a group in which one or more hydrogen atoms of a lower alkyl group of 5 or less carbon atoms are substituted with halogen atoms. Specific examples of the alkyl group are the same as those described above. The hydrogen atoms substituted with halogen atoms may be a part of or all of the hydrogen atoms which constitute the alkyl group.

In the present invention, R is preferably a hydrogen atom or an alkyl group, and more preferably a hydrogen atom or a methyl group, in terms of industrial availability.

In the general formula (a-1), $R_0$ represents an alkyl group containing a hydroxyl group.

The alkyl group is preferably a linear or branched alkyl group. The number of carbon atoms of the alkyl group is not specifically restricted, and preferably within a range from 1 to 5, more preferably from 1 to 4, and most preferably 2 or 3.

The number of hydroxyl groups is not specifically restricted, and preferably within a range from 1 to 4, more preferably from 1 to 3, and most preferably 1 or 2. The bonding position of the hydroxyl group is not specifically restricted, and the hydroxyl group is preferably bonded at the terminal of a main-chain or branched alkyl group, more preferably at the terminal of a main-chain alkyl group.

In the present invention, $R_0$ is preferably a hydroxyalkyl group or a dihydroxyalkyl group, and more preferably a hydroxyethyl group or a dihydroxypropyl group.

Structural unit (a0) can be used alone, or in combination of two or more different units.

The proportion of the structural unit (a0) in the polymer compound of the present invention is preferably 5 to 80 mol %, more preferably 10 to 70 mol %, and most preferably 15 to 50 mol %, relative to the combined total of all the structural units that constitute the polymer compound. Ensuring that this proportion is at least as large as the lower limit of the above provides the effect obtained by containing the structural unit (a0), that is, the effect of enabling the forming of a resist pattern with excellent resolution using a negative resist composition including a polymer compound containing the structural unit (a0). On the other hand, ensuring that the proportion is no greater than the upper limit enables a more favorable balance to be achieved with the other structural units.

Structural Unit (a1)

The polymer compound of the present invention preferably includes, in addition to the structural unit (a0), a structural unit (a1) containing an aliphatic cyclic group which has a fluorinated hydroxyalkyl group. When the polymer compound of the present invention contains the structural unit (a1), a resist composition formed using the polymer compound enables the resolution to be improved, because swelling of a resist pattern is suppressed when the pattern is formed.

The fluorinated hydroxyalkyl group represents a group wherein, in an alkyl group with a hydroxyl group, a part of or all of the hydrogen atoms bonded with carbon atoms of the alkyl group are substituted with fluorine atoms. The group tends easily to detach a hydrogen atom of a hydroxyl group because of the fluorination.

In the fluorinated hydroxyalkyl group, the alkyl group is preferably a linear or branched alkyl group. There is no particular restriction on the number of carbon atoms of the alkyl group, and the number is preferably within a range from 1 to 20, more preferably from 4 to 16, and most preferably from 4 to 12. There is no particular restriction on the number of hydroxyl groups of the alkyl group, and the number is preferably 1 or 2, and more preferably 1.

Of these, as the fluorinated hydroxyalkyl group, it is preferable that a fluorinated alkyl group and/or a fluorine atom are/is bonded with a carbon atom (herein, the carbon atom represents a carbon atom at the α-position of a hydroxyalkyl group) with which a hydroxyl group is bonded. The fluorinated alkyl group bonded with the α-position is preferably an alkyl group in which all of the hydrogen atoms are substituted with fluorine atoms.

The term "aliphatic" in "aliphatic cyclic group containing a fluorinated hydroxyalkyl group" is a relative concept used in relation to the term "aromatic", and is defined as a group or compound that contains no aromaticity.

An aliphatic cyclic group (alicyclic group) may be monocyclic or polycyclic.

The term "monocyclic aliphatic cyclic group" represents a monocyclic group that contains no aromaticity, whereas the term "polycyclic aliphatic cyclic group" represents a polycyclic group that contains no aromaticity. The aliphatic cyclic group of the structural unit (a1) is preferably polycyclic.

The aliphatic cyclic group contains a hydrocarbon group (alicyclic group) consisting of carbon atoms and hydrogen atoms, and a heterocyclic group in which a part of the carbon atoms which constitute a ring of the aliphatic cyclic group are substituted with heteroatoms such as oxygen atoms, nitrogen atoms and sulfur atoms. The aliphatic cyclic group is preferably an alicyclic group.

The aliphatic cyclic group may be either saturated or unsaturated, and a saturated aliphatic cyclic group is preferable because it exhibits high transparency relative to an ArF excimer laser and the like, and also exhibits excellent properties of resolution and depth of focus (DOF).

The number of carbon atoms of the aliphatic cyclic group is preferably within a range from 5 to 15.

Specific examples of the aliphatic cyclic group include the following:

Examples of monocyclic alicylic groups include groups in which two or more hydrogen atoms, including hydrogen atoms substituted with fluorinated hydroxyalkyl groups (hereinafter, referred to as the same), have been removed from a monocycloalkane. Specific examples thereof include groups in which two ore more hydrogen atoms have been removed from cyclopentane or cyclohexane, and groups in which two hydrogen atoms have been removed from cyclohexane are preferable.

Examples of polycyclic alicyclic groups include groups in which two or more hydrogen atoms are removed from a bicycloalane, a tricycloalkane, a tetracycloalkane or the like. Specific examples thereof include groups in which two or more hydrogen atoms are removed from a polycycloalkane such as adamantane, norbornane, isobornane, tricyclodecane, and tetracyclododecane.

These types of monocyclic and polycyclic alicyclic groups can be appropriately selected from the multitude of groups proposed as groups which constitute acid dissociable, dissolution inhibiting groups in resin components for positive resist compositions designed for use with ArF excimer lasers.

Of these groups, groups in which two hydrogen atoms have been removed from cyclohexane, adamantane, norbornane or tetracyclododecane are preferable in terms of industrial availability.

Of these monocyclic and polycyclic alicyclic groups, groups in which two hydrogen atoms have been removed from norbornane are particularly preferable.

The structural unit (a1) is preferably a structural unit derived from an acrylic acid, and it is particularly preferable that the structural unit (a1) is a group in which the aliphatic cyclic group described above is bonded with an oxygen atom (—O—) of a carbonyl group (—C(O)O—) of an acrylate ester (that is, a group in which a hydrogen atom of a carboxyl group of an acrylic acid is substituted with the aliphatic cyclic group described above).

More specifically, the structural unit (a1) is preferably a structural unit (a11) represented by a general formula (1) shown below.

[Formula 2]

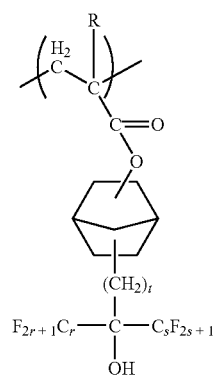

(1)

(wherein, R represents the same as those described above; and r, s and t each independently represents an integer from 1 to 5.)

R represents the same as R described in the structural unit (a0).

r and s each independently represents an integer from 1 to 5, preferably an integer from 1 to 3, and most preferably 1.

t represents an integer from 1 to 5, preferably an integer from 1 to 3, and most preferably 1.

Of the structural unit (a11) represented by the general formula (1), α,α'-bis-(trifluoromethyl)-bicyclo[2.2.1]hepta-5-ene-2-ethanol acrylate is preferable in terms of the effect, the ease of synthesis, and also in terms of obtaining high etching resistance.

The structural unit (a1) can be used alone, or in combination of two or more different units.

In the case of including the structural unit (a1) in the polymer compound of the present invention, the proportion of the structural unit (a1) is preferably within a range from 10 to 90 mol % more preferably from 20 to 90 mol %, still more preferably from 40 to 90 mol % and most preferably from 45 to 85 mol %, relative to the combined total of all the structural units that constitute the polymer compound. Ensuring this proportion is no less than the lower limit, the above effect obtained by containing the structural unit (a1) can be achieved, whereas ensuring this proportion is no more than the upper limit, a more favorable quantitative balance can be achieved with the other structural units.

Structural Unit (a2)

The polymer compound of the present invention preferably includes, in addition to the structural unit (a0), a structural unit (a2) derived from an acrylate ester containing a hydroxyl group-containing chain-like alkyl group. By including the structural unit (a2), when a resist composition including the polymer compound and the structural unit (a2) is formed and then a pattern is formed, a cross-linking reaction with the component (C) is controlled under an action of an acid generated by the component (B), thereby improving the resolution.

The structural unit (a2) is preferably, for example, a structural unit in which a chain-like hydroxyalkyl group is bonded with an ester group (—C(O)O—) of an acrylate ester.

More specifically, the structural unit (a2) is preferably a structural unit (a320) represented by a general formula (a3-2) shown below.

[Formula 3]

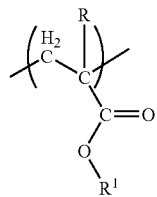

(a 3-2)

(wherein, R represents the same as those described above; and R' represents a hydroxyalkyl group.)

R in the general formula (a3-2) represents the same as R described in the structural unit (a0).

The hydroxyalkyl group as $R^1$ is preferably a lower hydroxyalkyl group of 10 or less carbon atoms, more preferably a lower hydroxyalkyl group of 2 to 8 carbon atoms, and still more preferably a linear lower hydroxyalkyl group of 2 to 4 carbon atoms.

There is no particular restriction on the number of hydroxyl groups of the hydroxyalkyl group and on the bonding position thereof. Usually, the number of the hydroxyl groups is 1, and it is preferable to be bonded at the terminal of the alkyl group.

The structural unit (a2) can be used alone, or in combination of two or more different units.

In the case that the polymer compound of the present invention contains the structural unit (a2), the proportion of the structural unit (a2) is preferably within a range from 5 to 50 mol %, more preferably from 5 to 40 mol %, still more preferably 5 to 30 mol %, and most preferably from 10 to 25 mol %, relative to the combined total of all the structural units that constitute the polymer compound. Ensuring this proportion is no less than the lower limit, the above effect obtained by containing the structural unit (a2) can be achieved, whereas ensuring this proportion is no more than the upper limit, a more favorable quantitative balance can be achieved with the other structural units.

In the case that the polymer compound of the present invention includes the structural units (a1) and (a2), the total proportion of the structural units (a1) and (a2) is preferably within a range from 20 to 90 mol %, more preferably from 30 to 80 mol %, and most preferably from 40 to 75 mol %, relative to the combined total of all the structural units that constitute the polymer compound.

Ensuring the total proportion of structural units (a1) and (a2) is within such range, when a resist composition is formed using the polymer compound, appropriate solubility relative to an alkali developing solution can be obtained, and resist pattern shape (rectangularity) can be improved.

Other Structural Units

The polymer compound of the present invention may include other structural units which can be copolymerized, as structural units other than the structural units (a0), (a1) and (a2).

As such a structural unit, a structural unit used as a known resin component for a conventional chemically-amplified resist composition can be used. Examples thereof include a structural unit (a4) derived from an acrylate ester which contains a lactone-containing monocyclic or polycyclic group.

When used for forming a resist film, the lactone-containing monocyclic or polycyclic group of the structural unit (a4) is effective in improving the adhesion between the resist film and the substrate, and increasing the hydrophilicity to the developing solution. Moreover, the structural unit (a4) also improves the swelling suppression effect.

Here, a lactone is referred to as a single ring containing —O—C(O)— structure, and this is counted as the first ring. Accordingly, the case in which the only ring structure is the lactone is referred to as a monocyclic group, and groups containing other ring structures are described as a polycyclic group regardless of the structure of the other rings.

Here, it is defined that the structural unit (a4) does not include those in which one or more hydrogen atoms in the lactone-containing monocyclic or polycyclic group are substituted with fluorinated hydroxyl alkyl groups.

The structural unit (a4) can be used without any limitation, as long as it has a lactone ring containing the ester structure (—O—C(O)—) and a ring structure.

Specific examples of the lactone-containing monocyclic group include a group wherein one hydrogen atom is eliminated from γ-butyrolactone. Examples of the lactone-containing polycyclic group include a group wherein one hydrogen atom is eliminated from bicycloalkane, tricycloalkane or tetracycloalkane.

In the structural unit (a4), a hydrogen atom bonded at the α-position (that is, with a carbon atom at the α-position) may be substituted with another substituent group. Examples of the substituent group include an alkyl group, a halogenated alkyl group and a halogen atom.

These substituent groups are same as R described above in the general formula (a0-1) in the structural unit (a0). Of the substituent groups which can be bond with the carbon atom at the α-position, a hydrogen atom and alkyl groups are preferable, a hydrogen atom and a methyl group are more preferable, and a hydrogen atom is most preferable.

Specific examples of the structural unit (a4) include structural units represented by the general formulae (a4-1) to (a4-5) shown below.

[Formula 4]

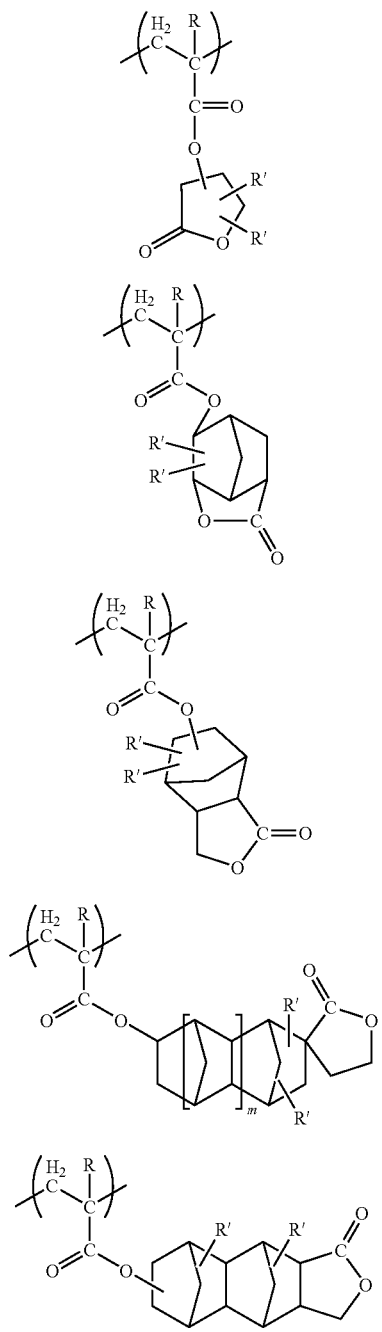

(wherein, R is the same as those described above; R' each represents, independently, a hydrogen atom, an alkyl group or an alkoxyl group of 1 to 5 carbon atoms; and m represents an integer of 0 or 1.)

The alkyl group of R' of the general formulae (a4-1) to (a4-5) represents the same as the alkyl group of R in the structural unit (a0). In the general formulae (a4-1) to (a4-5), R' is preferably a hydrogen atom in terms of industrial availability.

The structural unit (a4) is most preferably a unit represented by the general formula (a4-2) or (a4-3).

The structural unit (a4) can be used alone, or in combinations of two or more different units.

The structural unit (a4) is not an indispensable component. In the case of including the structural unit (a4), the proportion of the structural unit (a4) in the polymer compound of the present invention is preferably within a range from 10 to 70 mol %, more preferably from 10 to 40 mol %, and most preferably from 10 to 25 mol %, relative to the combined total of all the structural units that constitute the polymer compound. Ensuring this proportion is no less than the lower limit, the above effect obtained by containing the structural unit (a4) can be achieved, whereas ensuring this proportion is no more than the upper limit, a more favorable quantitative balance can be achieved with the other structural units.

The polymer compound of the present invention is a polymer containing at least the structural unit (a0), preferably a copolymer further containing the structural unit(s) (a1) and/or (a2) in addition to the structural unit (a0), and more preferably a copolymer containing the structural unit (a1) in addition to the structural unit (a0).

The polymer compound of the present invention is preferably a polymer compound containing a combination of the structural units particularly represented by the general formulae (A1-11) to (A1-14) shown below.

[Formula 5]

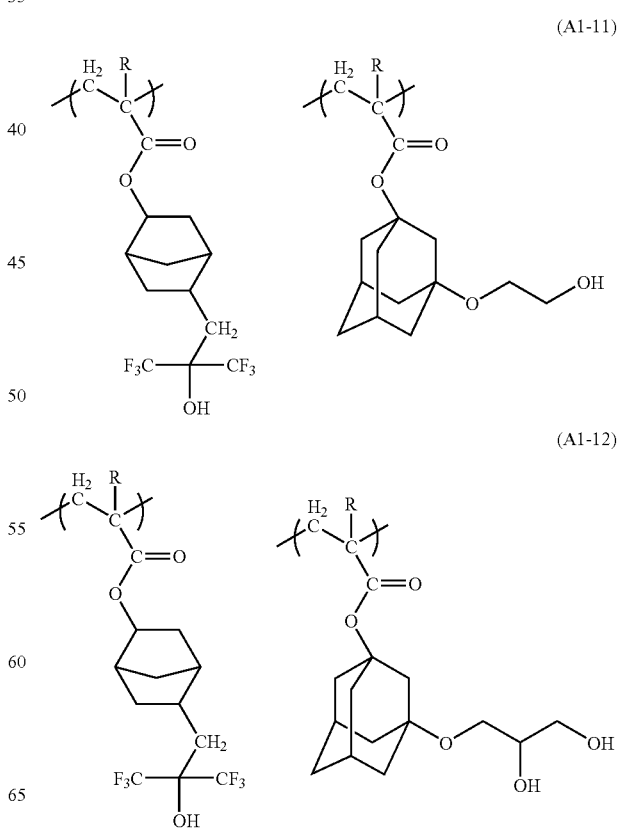

-continued

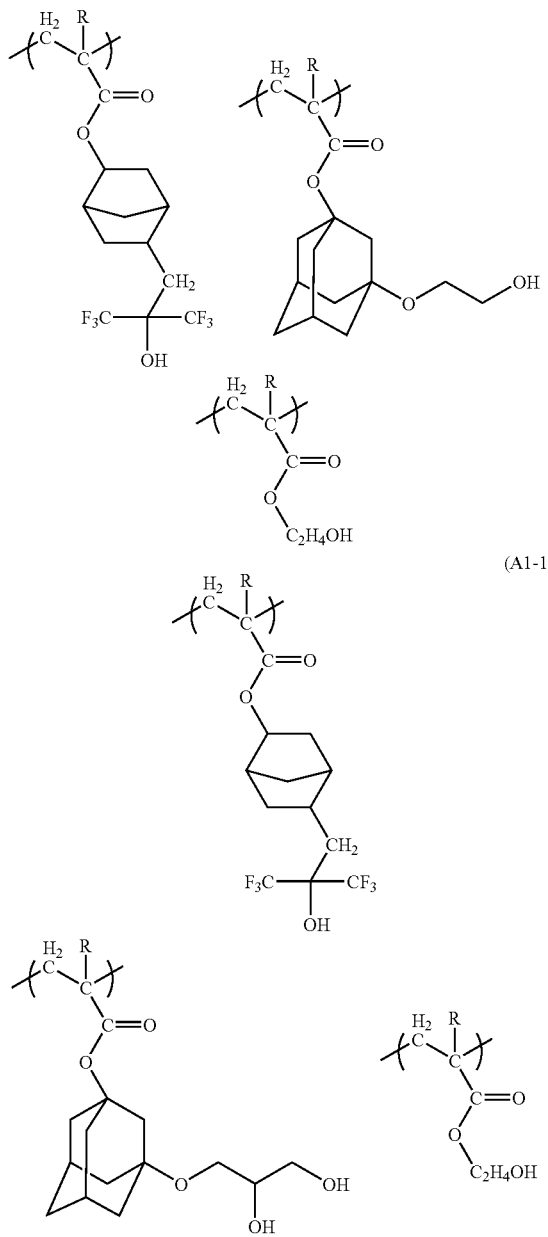

(wherein, R represents the same as those described above.)

The mass average molecular weight (Mw; polystyrene-equivalent mass average molecular weight) of the polymer compound of the present invention is preferably within a range from 2,000 to 30,000, more preferably from 3,000 to 10,000, and still more preferably 3,500 to 9,000. When the mass average molecular weight is adjusted within such range, an excellent solubility rate relative to an alkali developing solution can be obtained, and high resolution can be also obtained, therefore it is preferable. When mass average molecular weight is less within the range, more excellent properties tends to be obtained.

Further, the polydispersity (Mw/Mn) is preferably within a range from 1.0 to 5.0, and more preferably from 1.0 to 2.5. Herein, Mn represents the number average molecular weight.

The polymer compound of the present invention can be obtained, for example, by conventional radical polymerization or the like of the monomers corresponding with each of the structural units.

The manufacturing method of monomers corresponding with the structural unit (a0) represented by the general formula (a0-1) is as follows: Firstly, a hydroxyadamantane acrylate compound is reacted with a methanesulfonyl group-containing compound in the presence of a base catalyst. Subsequently, the reaction product is reacted with an alcohol compound containing a hydrocarbon group of 2 to 20 carbon atoms in the presence of a base catalyst. As a result, the monomer corresponding with the structural unit (a0) represented by the general formula (a0-1) can be synthesized.

<<Negative Resist Composition>>

The negative resist composition of the present invention includes an alkali-soluble resin component (A) (hereinafter, referred to as component (A)), an acid generator component (B) which generates an acid upon exposure (hereinafter, referred to as component (B)), and a cross-linking agent (C) (hereinafter, referred to as component (C)).

The negative resist composition is alkali soluble before exposure. When an acid is generated by the component (B) under the exposure, the acid causes a reaction between the component (A) and the component (C), and thus the composition changes from an alkali-soluble state to an alkali-insoluble state. Consequently, when a resist film formed by applying the negative resist composition on a substrate is selectively exposed, the exposed sections of the film changes to alkali insoluble, whereas the unexposed sections of the film remain alkali soluble. Then, an alkali development treatment is conducted, thereby enabling formation of a negative resist pattern.

<Component (A)>

In the present invention, the component (A) includes (A1) a polymer compound (hereinafter, referred to as component (A1)) which contains a structural unit (a0) represented by the general formula (a0-1).

It is preferable that the component (A1) further includes a structural unit (a1) which contains an aliphatic cyclic group having a fluorinated hydroxyalkyl group.

Also, it is preferable that the component (A1) further includes a structural unit (a2) derived from an acrylate ester which has a hydroxyl group-containing chain-like alkyl group.

As the component (A1), the polymer compound of the present invention described above is used. The mass average molecular weight, dispersion degree, and manufacturing method of the structural units (a0), (a1), (a2) and other structural units which constitute the component (A1) are the same as those described above, and thus an explanation is omitted.

In the component (A), the above component (A1) can be used alone, or in combinations of two or more different components.

Further, the component (A) can include, in addition to the component (A1), other polymer compounds known as those used for a negative resist composition, such as hydroxystyrene resin, novolak resin, and acrylic resin.

The proportion of the component (A1) in the component (A) is preferably 50% by mass or more, more preferably 70% by mass or more, still more preferably 80% by mass or more, and most preferably 100% by mass.

<Component (B)>

There is no particular restriction on the component (B), and known materials proposed as acid generators used for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by a general formula (b-0) shown below can be preferably used.

[Formula 6]

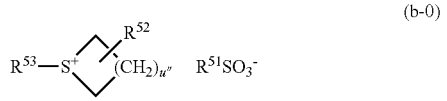

(b-0)

(wherein, $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may contain a substituent group; and u" represents an integer of 1 to 3.)

In the general formula (b-0), $R^{51}$ represents a linear, branched or cyclic alkyl group, or a linear, branched or cyclic fluorinated alkyl group.

The number of carbon atoms in the linear or branched alkyl group of $R^{51}$ is preferably from 1 to 10, more preferably from 1 to 8, and most preferably from 1 to 4.

The number of carbon atoms in the cyclic alkyl group of $R^{51}$ is preferably from 4 to 12, more preferably from 5 to 10, and most preferably from 6 to 10.

The number of carbon atoms in the linear or branched fluorinated alkyl group of $R^{51}$ is preferably from 1 to 10, more preferably from 1 to 8, and most preferably from 1 to 4. The number of carbon atoms in the cyclic fluorinated alkyl group of $R^{51}$ is preferably from 4 to 12, more preferably from 5 to 10, and most preferably from 6 to 10. The fluorination rate of the fluorinated alkyl group (proportion of substituted fluorine atoms relative to all hydrogen atoms before substitution in the alkyl group) is preferably within a range from 10 to 100%, more preferably from 50 to 100%, and particularly preferably those wherein all hydrogen atoms are substituted with a fluorine atom, because the strength of the acid increases.

$R^{51}$ is preferably a linear alkyl group or a linear fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom of $R^{52}$ include a fluorine atom, a bromine atom, a chlorine atom and an iodine atom. Of these, a fluorine atom is preferable. The alkyl group of $R^{52}$ is linear or branched, the number of carbon atoms in the alkyl group of $R^{52}$ is preferably from 1 to 5, more preferably from 1 to 4, and still more preferably from 1 to 3.

The halogenated alkyl group of $R^{52}$ is a group in which a part of or all of hydrogen atoms of the alkyl group are substituted with halogen atoms. The alkyl group in the halogenated alkyl group represents the same as "alkyl group" of $R^{52}$. The halogen atoms which replace the hydrogen atoms represent the same as those described above in "halogen atoms" In the halogenated alkyl group, 50 to 100% of all the hydrogen atoms are preferably substituted with halogen atoms, and it is more preferable that all of hydrogen atoms are substituted with halogen atoms.

The alkoxy group of $R^{52}$ is linear or branched, and the number of carbon atoms in the alkoxy group of $R^{52}$ is preferably from 1 to 5, more preferably from 1 to 4, and still more preferably from 1 to 3.

Of these, $R^{52}$ is preferably a hydrogen atom.

$R^{53}$ represents an aryl group which may have a substituent group. Examples of the structure of the basic ring from which a substituent group is removed include a naphthyl group, a phenyl group and an anthracenyl group. Of these, a phenyl group is preferable in terms of the effects of the present invention, and excellent absorption of exposure light such as ArF excimer lasers.

Examples of the substituent group include a hydroxyl group, a lower alkyl group (linear or branched lower alkyl group, preferably an alkyl group of 5 or less carbon atoms, and particularly preferably a methyl group).

The aryl group of $R^{53}$ is more preferably those without a substituent group.

u" represents an integer of 1 to 3, preferably 2 or 3, and still more preferably 3.

Suitable examples of the acid generator represented by the general formula (b-0) include the following:

[Formula 7]

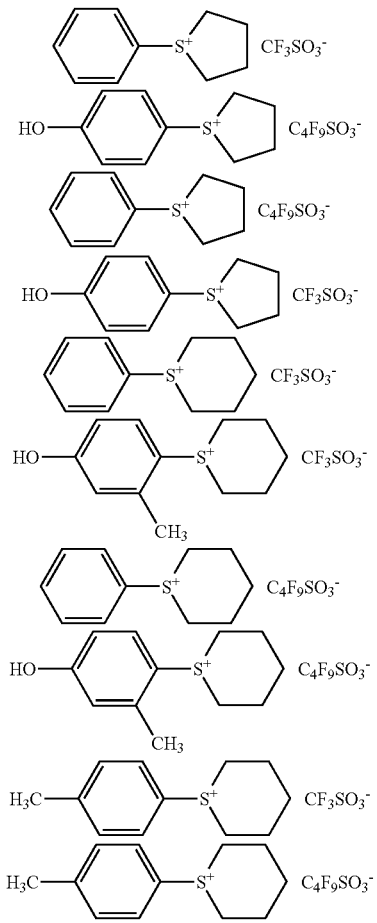

The acid generator represented by the general formula (b-0) can be used alone, or in combinations of two or more different components.

Further, as another onium salt-based acid generator which is different from the acid generator represented by the general formula (b-0), compounds represented by a general formula (b-1) or (b-2) shown below can also be preferably used.

[Formula 8]

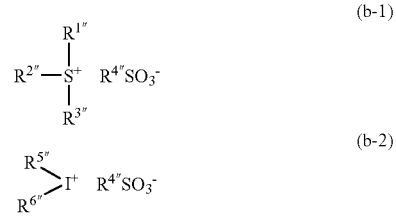

(wherein, $R^{1"}$ to $R^{3"}$, $R^{5"}$ and $R^{6"}$, each independently, represents an aryl group or an alkyl group; $R^{4"}$ represents a linear, branched or cyclic alkyl group or a linear, branched or cyclic fluorinated alkyl group; at least one of $R^{1"}$ to $R^{3"}$ represents an aryl group; and at least one of $R^{5"}$ and $R^{6"}$ represents an aryl group.)

In the general formula (b-1), $R^{1"}$ to $R^{3"}$, each independently, represents an aryl group or an alkyl group. At least one of $R^{1"}$ to $R^{3"}$ represents an aryl group. Two or more of $R^{1"}$ to $R^{3"}$ are preferably aryl groups, and all of $R^{1"}$ to $R^{3"}$ are most preferably aryl groups.

There is no particular restriction on the aryl group of $R^{1"}$ to $R^{3"}$. For example, the aryl group is an aryl group of 6 to 20 carbon atoms, and a part of or all of hydrogen atoms of the aryl group may be substituted with an alkyl group, an alkoxy group, a halogen atom and the like, or may be not substituted. The aryl group is preferably an aryl group of 6 to 10 carbon atoms because it can be synthesized inexpensively. Specific examples thereof include a phenyl group and a naphthyl group.

The alkyl group of the aryl group in which hydrogen atoms may be substituted is preferably an alkyl group of 1 to 5 carbon atoms, and most preferably a methyl group, an ethyl group, a propyl group, an n-butyl group, and a tert-butyl group.

The alkoxy group of the aryl group in which hydrogen atoms may be substituted is preferably an alkoxy group of 1 to 5 carbon atoms, and most preferably a methoxy group and an ethoxy group.

The halogen atom of the aryl group in which hydrogen atoms may be substituted is preferably a fluorine atom.

There is no restriction on the alkyl groups of $R^{1"}$ to $R^{3"}$. Examples thereof include a linear, branched or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

Of these, it is most preferable that all of $R^{1"}$ to $R^{3"}$ are phenyl groups. $R^{4"}$ represents a linear, branched or cyclic alkyl group or a linear, branched or cyclic fluorinated alkyl group.

The number of carbon atoms in the linear alkyl group of $R^{4"}$ is preferably from 1 to 10, more preferably from 1 to 8, and most preferably from 1 to 4.

The cyclic alkyl group of $R^{4"}$ is the same as the cyclic group described in $R^{1"}$. The number of carbon atoms in the cyclic alkyl group of $R^{41"}$ is preferably from 4 to 15, more preferably from 4 to 10, and most preferably from 6 to 10.

The number of carbon atoms in the fluorinated alkyl group is preferably from 1 to 10, more preferably from 1 to 8, and most preferably from 1 to 4. The fluorination rate of the fluorinated alkyl group proportion of fluorine atoms in the alkyl group) is preferably from 10 to 100%, more preferably from 50 to 100%, and particularly preferably those wherein all hydrogen atoms are substituted with fluorine atoms, because the strength of the acid increases.

$R^{4"}$ is most preferably a linear or cyclic alkyl group or a linear or cyclic fluorinated alkyl group.

In the general formula (b-2), $R^{5"}$ and $R^{6"}$, each independently, represents an aryl group or an alkyl group. At least one of $R^{5"}$ and $R^{6"}$ represents an aryl group. Both of $R^{5"}$ and $R^{6"}$ preferably represent aryl groups.

The aryl groups of $R^{5"}$ and $R^{6"}$ represent the same as those described in "aryl group" of $R^{1"}$ to $R^{3"}$.

The alkyl groups of $R^{5"}$ and $R^{6"}$ represent the same as those described in "alkyl group" of $R^{1"}$ to $R^{3"}$.

Of these, it is most preferable that both $R^{5"}$ and $10"$ are phenyl groups. $R^{4"}$ in the general formula (b-2) represents the same as those described in $R^{41}$ in the general formula (b-1) shown above.

Specific examples of an onium salt-based acid generator represented by the general formulae (b-1) and (b-2) include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate of triphenylsulfonium, heptafluoropropanesulfonate or nonafluorobutanesulfonate thereof trifluoromethanesulfonate of tri(4-methylphenyl)sulfonium, heptafluoropropanesulfonate or nonafluorobutanesulfonate thereof, trifluoromethanesulfonate of dimethyl(4-hydroxynaphthyl)sulfonium, heptafluoropropanesulfonate or nonafluorobutanesulfonate thereof, trifluoromethanesulfonate of monophenyldimethylsulfonium, heptafluoropropanesulfonate or nonafluorobutanesulfonate thereof, trifluoromethanesulfonate of diphenylmonomethylsulfonium, heptafluoropropanesulfonate or nonafluorobutanesulfonate thereof trifluoromethanesulfonate of (4-methylphenyl)diphenylsulfonium, heptafluoropropanesulfonate or nonafluorobutanesulfonate thereof, trifluoromethanesulfonate of (4-methoxyphenyl)diphenylsulfonium, heptafluoropropanesulfonate or nonafluorobutanesulfonate thereof, trifluoromethanesulfonate of tri(4-tert-butyl)phenylsulfonium, heptafluoropropanesulfonate or nonafluorobutanesulfonate thereof, trifluoromethansulfonate of diphenyl(1-(4-methoxy)naphtyl)sulfonium heptafluoropropanesulfonate or nonafluorobutanesulfonate thereof. Also, onium salts in which anionic sites of these onium salts are substituted with methanesulfonate, n-propanesulfonate, n-buthanesulfonate, or n-octanesulfonate can be used.

Further, an onium salt-based acid generator in which the anionic site in the general formula (b-1) or (b-2) is substituted with an anionic site represented by a general formula (b-3) or (b-4) shown below can be also used. Here, the cationic site is the same as those described in the general formula (b-1) or (b-2)

[Formula 9]

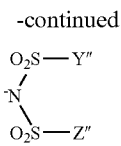
(b-4)

(wherein, X" represents an alkylene group of 2 to 6 carbon atoms in which at least one hydrogen atom is substituted with a fluorine atom; and Y" and Z", each independently, represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group of X" is from 2 to 6, preferably from 3 to 5, and most preferably 3.

Y" and Z", each independently, represents a linear or branched alkyl group in which at least one hydrogen atom is substituted with a fluorine atom. The number of carbon atoms in the alkyl group of Y" and Z" is from 1 to 10, preferably from 1 to 7, and more preferably from 1 to 3.

Lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", higher numbers of hydrogen atoms that have been substituted with fluorine atoms result in increasing the strength of an acid, and also improving the transparency relative to high energy light beams of 200 nm or less or electron beams, and are consequently preferred. The portion of the fluorine atom within the alkylene groups or alkyl groups, namely the fluorination ratio, is preferably within a range from 70 to 100%, and more preferably from 90 to 100%, and perfluoroalkylene or perfluoroalkyl groups in which all of the hydrogen atoms have been substituted with fluorine atoms are most preferable.

The term "oxime sulfonate-based acid generator" of the present invention represents a compound which has at least one group represented by a general formula (B-1) shown below, and has a property to generate an acid upon exposure to radiation. These kinds of oxime sulfonate-based acid generators described above are widely used for a chemically-amplified resist composition, so any oxime sulfonate-based acid generator can be used arbitrarily selected from those.

[Formula 10]

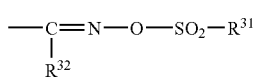
(B-1)

(in the general formula (B-1), $R^{31}$ and $R^{32}$, each independently, represents an organic group.)

The organic groups of $R^{31}$ and $R^{32}$ are groups containing carbon atoms, and may further contain atoms other than carbon atoms (for example, a hydrogen atom, a oxygen atom, a nitrogen atom, a sulfur atom and a halogen atom (a fluorine atom, a chlorine atom and the like)).

The organic group of $R^{31}$ is preferably a linear, branched or cyclic alkyl group or an aryl group. The alkyl group or aryl group may contain a substituent group. There is no particular restriction on the substituent group, and examples thereof include a fluorine atom, a linear, branched or cyclic alkyl group of 1 to 6 carbon atoms. Here, the term "containing a substituent group" represents that a part of or all of hydrogen atoms of an alkyl group or an aryl group are substituted with substituent groups.

The number of carbon atoms in the alkyl group of $R^{31}$ is preferably from 1 to 20, more preferably from 1 to 10, still more preferably from 1 to 8, still more preferably from 1 to 6, and most preferably from 1 to 4. The alkyl group of $R^{31}$ is particularly preferably an alkyl group which is partially or completely halogenated (hereinafter, sometimes referred to as a halogenated alkyl group). Here, a partially halogenated alkyl group represents an alkyl group in which a part of the hydrogen atoms are substituted with halogen atoms, and a completely halogenated alkyl group represents an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, a halogenated alkyl group is preferably a fluorinated alkyl group.

The number of carbon atoms in the aryl group of $R^{31}$ is preferably from 4 to 20, more preferably from 4 to 10, and most preferably from 6 to 10. The aryl group is particularly preferably an aryl group which is partially or completely halogenated. Here, a partially halogenated aryl group represents an aryl group in which a part of the hydrogen atoms are substituted with halogen atoms, and a completely halogenated aryl group represents an aryl group in which all of the hydrogen atoms are substituted with halogen atoms.

$R^{31}$ is particularly preferably an alkyl group of 1 to 4 carbon atoms containing no substituent group, or a fluorinated alkyl group of 1 to 4 carbon atoms.

The organic group of $R^{32}$ is preferably a linear, branched or cyclic alkyl group, an aryl group or a cyano group. The alkyl group or aryl group of $R^{32}$ represents the same as those described above in the alkyl group or aryl group of $R^{31}$.

$R^{32}$ is particularly preferably a cyano group, an alkyl group of 1 to 8 carbon atoms containing no substituent group, or a fluorinated alkyl group of 1 to 8 carbon atoms.

The oxime sulfonate-based acid generator is more preferably a compound represented by a general formula (B-2) or (B-3) shown below.

[Formula 11]

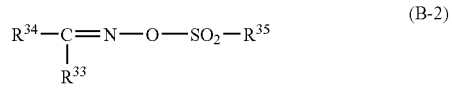
(B-2)

(in the general formula (B-2), $R^{33}$ represents a cyano group, an alkyl group containing no substituent group, or a halogenated alkyl group; and $R^{34}$ represents an aryl group; and $R^{35}$ represents an alkyl group containing no substituent group or a halogenated alkyl group.)

[Formula 12]

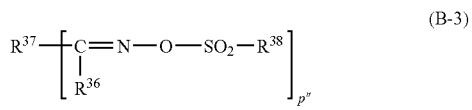
(B-3)

(in the general formula (B-3), $R^{36}$ represents a cyano group, an alkyl group containing no substituent group, or a halogenated alkyl group; $R^{37}$ represents a bivalent or trivalent aromatic hydrocarbon atom; $R^{38}$ represents an alkyl group containing no substituent group or a halogenated alkyl group; and p" represents an integer of 2 or 3.)

In the general formula (B-2), the number of carbon atoms in the alkyl group containing no substituent group or the halogenated alkyl group of $R^{33}$ is preferably from 1 to 10, more preferably from 1 to 8, and most preferably from 1 to 6.

$R^{33}$ is preferably a halogenated alkyl group, and more preferably a fluorinated alkyl group.

The fluorinated alkyl group of $R^{33}$ is preferably a group in which 50% or more of the hydrogen atoms of the alkyl group are fluorinated, more preferably a group in which 70% or more of the hydrogen atoms of the alkyl group are fluorinated, and still more preferably a group in which 90% or more of the hydrogen atoms of the alkyl group are fluorinated.

Examples of the aryl group represented by $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group; and heteroaryl groups in which a part of the carbon atoms which constitutes the ring(s) of these groups are substituted with heteroatoms such as an oxygen atom, a sulfur atom, and a nitrogen atom. Of these, a fluorenyl group is preferable.

The aryl group of $R^{34}$ may contain a substituent group such as an alkyl group, a halogenated alkyl group and an alkoxy group of 1 to 10 carbon atoms. The number of carbon atoms in the alkyl group or halogenated alkyl group of the substituent group is preferably from 1 to 8, and more preferably from 1 to 4. Also, the halogenated alkyl group is preferably a fluorinated alkyl group.

The number of carbon atoms in the alkyl group containing no substituent group or the halogenated alkyl group of $R^{35}$ is preferably from 1 to 10, more preferably from 1 to 8, and most preferably from 1 to 6.

$R^{35}$ is preferably a halogenated alkyl group, more preferably a fluorinated alkyl group, and most preferably a partially fluorinated alkyl group.

The fluorinated alkyl group of $R^{35}$ is preferably a group in which 50% or more of the hydrogen atoms of the alkyl group are fluorinated, more preferably a group in which 70% or more of the hydrogen atoms of the alkyl group are fluorinated, and still more preferably a group in which 90% or more of the hydrogen atoms of the alkyl group are fluorinated, because the strength of the generated acid increases. The fluorinated alkyl group of $R^{35}$ is most preferably a completely fluorinated alkyl group in which 100% of the hydrogen atoms are substituted with fluorine atoms.

In the general formula (B-3), the alkyl group containing no substituent group or the halogenated alkyl group of $R^{36}$ is the same as those above in the alkyl group containing no substituent group or the halogenated alkyl group of $R^{33}$.

Examples of the bivalent or trivalent aromatic hydrocarbon group of $R^{37}$ include aryl groups of $R^{34}$ in which one or two hydrogen atoms are further removed.

The alkyl group containing no substituent group or the halogenated alkyl group of $R^{38}$ is the same as those described above in the alkyl group containing no substituent group or the halogenated alkyl group of $R^{35}$.

p" is preferably 2.

Specific examples of the oxime sulfonate-based acid generator include

α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-octenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cycloohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimo)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and international Publication WO 2004/074242A2 (Examples 1 to 40 on pages 65 to 85) can be preferably used.

Further, suitable examples thereof include the following:

[Formula 13]

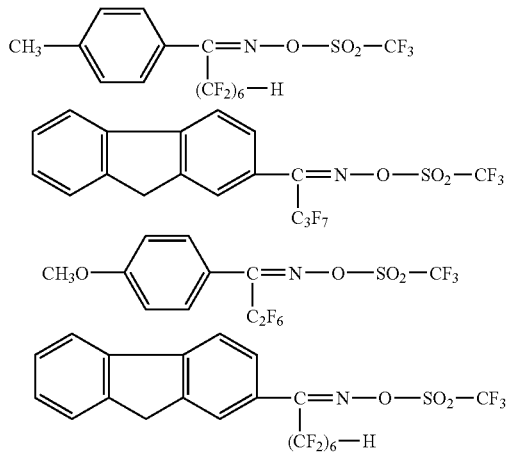

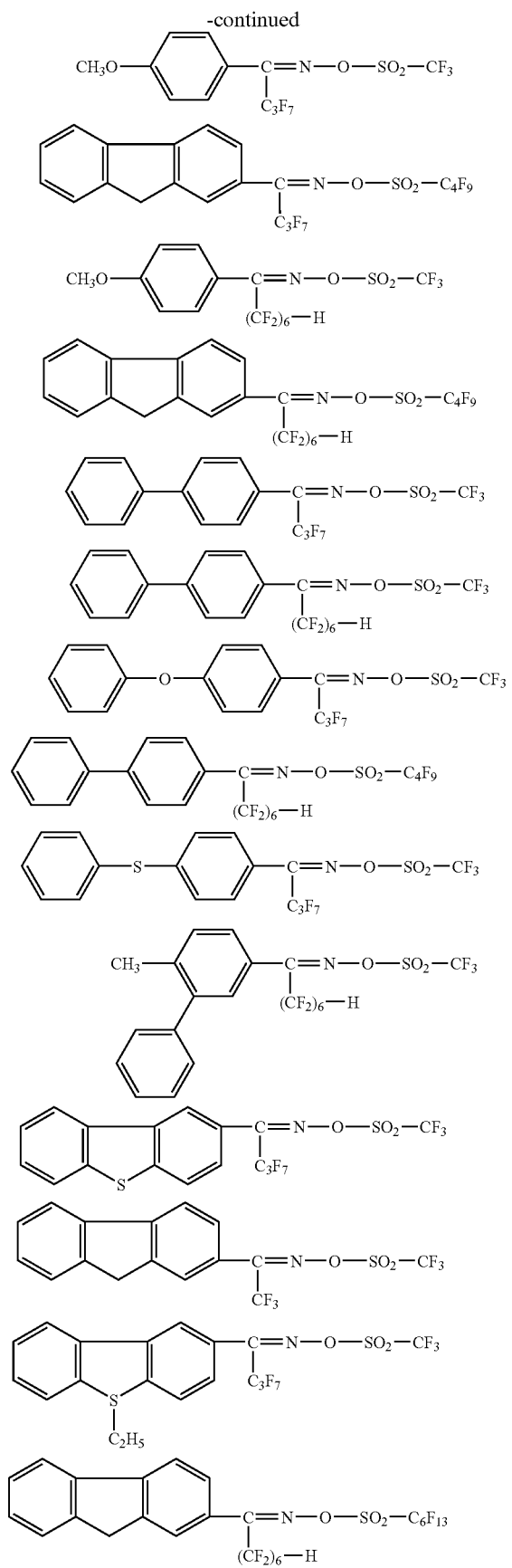

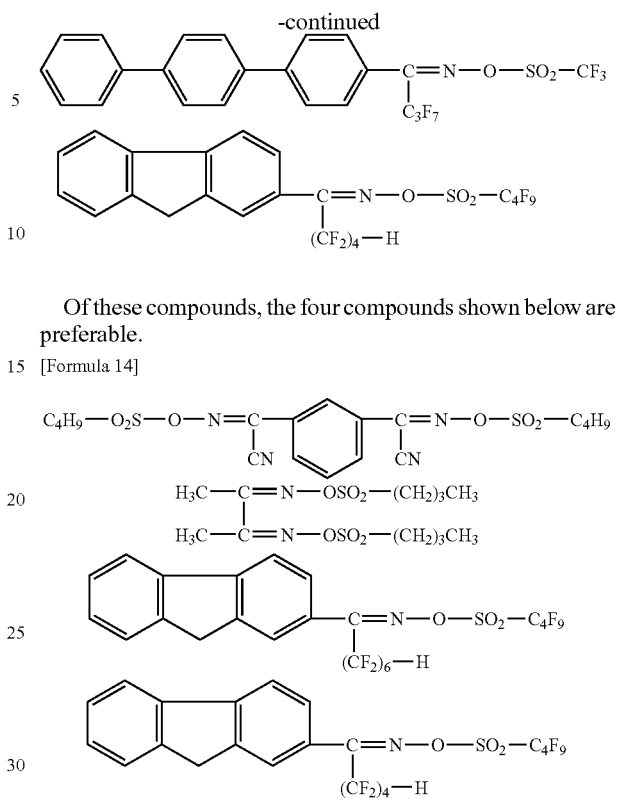

Of these compounds, the four compounds shown below are preferable.

[Formula 14]

Structures shown.

In the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei 11-035573 can be preferably used.

Examples of the poly(bissulfonyl)diazomethanes include 1,3-bisphenylsulfonyldiazomethylsulfonyl)propane, 1,4-bis(phenylsulfonyldiazomethylsulfonyl)butane, 1,6-bisphenylsulfonyldiazomethylsulfonyl)hexane, 1,10-bisphenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

Of these, as the component (B) in the present invention, onium salts with a fluorinated alkylsulfonate ion as the anion are preferably used. Specifically, triphenylsulfonium trifluoromethanesulfonate and the like are preferable.

The amount of the component (B) in the negative resist composition of the present invention is preferably within a range from 0.5 to 30 parts by mass, and more preferably from 1 to 10 parts by mass, based on 100 parts by mass of the component (A). When the amount is within the range, a pattern can be sufficiently formed. Also, a uniform solution and an excellent storage stability can be obtained, therefore an amount within the range is preferable.

<Component (C)>

There is no particular restriction on the component (C), and any known cross-linking agent that has been used in conventional chemically-amplified negative resist compositions can be used.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bishydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a mixture of formaldehyde and a lower alcohol, thereby substituting a hydrogen atom of the amino group with a hydroxymethyl group or a lower alkoxymethyl group.

Amongst such compounds, those that use melamine are referred to as melamine-based cross-linking agents, those that use urea are referred to as urea-based cross-linking agents, those that use an alkylene urea such as ethylene urea and propylene urea are referred to as alkylene urea-based cross-linking agents, and those that use glycoluril are referred to as glycoluril-based cross-linking agents. As the component (C), at least one compound selected from the group consisting of melamine-based cross-linking agents, urea-based cross-linking agents, alkylene urea-based cross-linking agents and glycoluril-based cross-linking agents is preferred. Of these, glycoluril-based cross-linking agents are particularly preferable.

Examples of the melamine-based cross-linking agents include compounds produced by reacting melamine and formaldehyde, thereby substituting a hydrogen atom of the amino group with a hydroxymethyl group, and compounds produced by reacting melamine, formaldehyde, and a lower alcohol thereby substituting a hydrogen atom of the amino group with a lower alkoxymethyl group. Specific examples thereof include hexamethoxymethylmelamine, hexaethoxymethylmelamine, hexapropoxymethylmelamine, and hexabutoxybutylmelamine. Of these, hexamethoxymethylmelamine is preferred.

Examples of the urea-based cross-linking agents include compounds produced by reacting urea and formaldehyde, thereby substituting a hydrogen atom of the amino group with a hydroxymethyl group, and compounds produced by reacting urea, formaldehyde, and a lower alcohol, thereby substituting a hydrogen atom of the amino group with a lower alkoxymethyl group. Specific examples thereof include bismethoxymethylurea, bisethoxymethylurea, bispropoxymethylurea, and bisbutoxymethylurea. Of these, bismethoxymethylurea is preferred.

Examples of the alkylene urea-based cross-linking agents include compounds represented by a general formula (C-1) shown below.

[Formula 15]

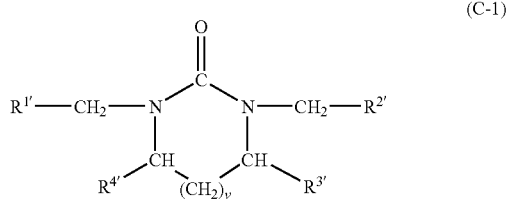

(C-1)

(wherein, $R^{1\prime}$ and $R^{2\prime}$, each independently, represents a hydroxyl group or a lower alkoxy group; $R^{3\prime}$ and $R^{4\prime}$, each independently, represents a hydrogen atom, a hydroxyl group or a lower alkoxy group; and v is 0, or an integer of 1 or 2.)

When each of $R^{1\prime}$ and $R^{2\prime}$ is a lower alkoxy group, the alkoxy group preferably has 1 to 4 carbon atoms, and may be either a linear or branched group. $R^{1\prime}$ and $R^{21}$ may be the same, or may be different from each other. More preferably, $R^{1}$ and $R^{2\prime}$ are the same.

When each of $R^{3\prime}$ and $R^{4\prime}$ is a lower alkoxy group, the alkoxy group preferably has carbon atoms of 1 to 4, and may be either a linear or branched group. $R^{3\prime}$ and $R^{4\prime}$ may be the same, or may be different from each other. More preferably, $R^{3\prime}$ and $R^{4\prime}$ are the same.

v is 0, an integer of 1 or 2, and preferably 0 or 1.

In particular, the alkylene urea-based cross-linking agent is preferably a compound in which v is 0 (ethylene urea-based cross-linking agent) and/or a compound in which v is 1 (propylene urea-based cross-linking agent).

The compounds represented by the general formula (C-1) shown above can be obtained by the condensation reaction of alkylene urea and formaldehyde, or by the reaction of the product thus obtained with a lower alcohol.

Specific examples of the alkylene urea-based cross-linking agents include ethylene urea-based cross-linking agents such as mono- and/or dihydroxymethylated ethylene urea, mono- and/or dimethoxymethylated ethylene urea, mono- and/or diethoxymethylated ethylene urea, mono- and/or dipropoxymethylated ethylene urea, and mono- and/or di-butoxymethylated ethylene urea; propylene urea-based cross-linking agents such as mono- and/or dihydroxymethylated propylene urea, mono- and/or dimethoxymethylated propylene urea, mono- and/or diethoxymethylated propylene urea, mono- and/or dipropoxymethylated propylene urea, and mono- and/or dibutoxymethylated propylene urea;

1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linking agents include glycoluril derivatives in which the N-position is substituted with a hydroxyalkyl group and/or an alkoxyalkyl group of 1 to 4 carbon atoms. Such glycoluril derivatives can be obtained by the condensation reaction of glycoluril and formaldehyde, or by the reaction of the product thus obtained with a lower alcohol.

Specific examples of the glycoluril-based cross-linking agents include mono-, di-, tri- and/or tetrahydroxymethylated glycoluril, mono-, di-, tri- and/or tetramethoxymethylated glycoluril, mono-, di-, tri- and/or tetraethoxymethylated glycoluril, mono-, di-, tri- and/or tetrapropoxymethylated glycoluril, and mono-, di-, tri- and/or tetrabutoxymethylated glycoluril.

The component (C) can be used either alone or in combination of two or more different cross-linking agents.

The quantity of the component (C) is preferably within a range from 3 to 30 parts by mass, more preferably from 3 to 15 parts by mass, and most preferably from 5 to 10 parts by mass, based on 100 parts by mass of the component (A). Ensuring the quantity of the component (C) is no less than the lower limit, a cross-linking formation progresses adequately, and an excellent resist pattern can be achieved. Ensuring the quantity of the component (C) is no more than the upper limit, an excellent storage stability of the resist coating solution can be obtained, and temporal deterioration of sensitivity can be suppressed.

<Optional Components>

In order to improve the resist pattern shape and the post exposure stability of the latent image formed by the pattern-wise exposure of the resist layer, a nitrogen-containing organic compound (D) (hereinafter, referred to as component (D)) is preferably added to the resist composition as an optional component.

Since a multitude of these components (D) have already been proposed, any of these know compounds can be used. Of these, an aliphatic amine, particularly a secondary aliphatic amine or tertiary aliphatic amine is preferred.

Examples of the aliphatic amine include amine (alkylamine or alkyl alcoholamine) wherein at least one of the hydrogen atoms of $NH_3$ is substituted with an alkyl or hydroxyalkyl group having 12 or less carbon atoms. Specific examples thereof include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, or tri-n-octanolamine. Among these amines, alkylalcoholamines and trialkylamines are preferable, and alkylalcoholamine is most preferable. Of the alkylalcoholamines, triethanolamine and tripropanolamine are most preferable.

These may be used either alone, or in combination of two or more different compounds.

The component (D) is typically used in a quantity within a range from 0.01 to 5.0 parts by weight, based on 100 parts by weight of the component (A).

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof (E) may also be added as another optional component (hereinafter, referred to as component (E)). The component (D) and the component A) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate or derivatives thereof such as esters; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is used in a quantity within a range from 0.01 to 5.0 parts by weight, based on 100 parts by weight of the component (A).

To the negative resist composition of the present invention, if desired, additives having miscibility, for example, additive resins for improving performances of a resist film, surfactants for improving coatability, dissolution inhibitors, plasticizers, stabilizers, colorants, antihalation agents, and dyes can be appropriately added.

The negative resist composition of the present invention can be prepared by dissolving materials in an organic solvent (hereinafter, sometimes referred to as component (S)).

The component (S) may be an organic solvent which can dissolve the respective components used to give a uniform solution, and one or more kinds of organic solvents can be used, appropriately selecting from those which have been conventionally known as a solvent of a chemically-amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols and derivatives thereof, such as ethylene glycol, diethylene glycol, propylene glycol, dipropylene glycol; derivatives of the polyhydric alcohols, such as compounds having ester bonds such as ethylene glycol monoacetate, diethylene glycol monoacetate, propylene glycol monoacetate and dipropylene glycol monoacetate, and compounds having ether bonds such as monoalkyl ethers (for examples, monomethyl ether, monoethyl ether, monopropyl ether and monobutyl ether) and monophenyl ether of the polyhydric alcohols or the compounds having ester bonds; cyclic ethers such as dioxane; esters such as methyl lactate, ethyl lactate (EL), methyl acetate, ethyl acetate, butyl acetate, methyl pyruvate, ethyl pyruvate, methyl methoxypropionate methyl, ethyl ethoxypropionate.

Of these, propylene glycol monomethyl ether acetate (PGMEA), propylene glycol monomethyl ether (PGME) and EL are preferable, and PGME is more preferable.

These organic solvents may be used either alone, or as a mixed solvent of two or more different solvents may be used.

A mixed solvent obtained by mixing PGMEA and a polar solvent is preferable. The mixing ratio (mass ratio) of PGMEA to the polar solvent may be appropriately decided taking account of compatibility, but is preferably adjusted within a range from 1:9 to 9:1, and more preferably from 2:8 to 8:2.

More specifically, when mixed with EL as the polar solvent, the mass ratio PGMEA:EL is preferably from 1:9 to 9:1, and more preferably from 2:8 to 8:2.

Furthermore, in those cases where PGME is added as the polar solvent, the mass ratio PGME:PGME is preferably from 1:9 to 9:1, more preferably 2:8 to 8:2, and still more preferably 3:7 to 7:3.

Furthermore, as the organic solvent, mixed solvents containing at least one of PGMEA and EL, together with γ-butyrolactone, are also preferred. In such cases, the mass ratio of the former and latter components in the mixed solvent is preferably within a range from 70:30 to 95:5.

There are no particular restrictions on the quantity used of the component (S), and the quantity should be set in accordance with the required coating film thickness within a concentration that enables favorable application of the solution to a substrate or the like. Typically, the quantity is set so that the solid fraction concentration within the resist composition falls within a range from 2 to 20% by weight, and still more preferably from 5 to 15% by weight.

<<Resist Pattern-Forming Method>>

The resist pattern-forming method of the present invention includes the steps of forming a resist film on a substrate using the negative resist composition, exposing the resist film, developing the resist film to form a resist pattern.

The resist pattern-forming method of the present invention can be performed, for example, in the following manner.

Namely, the negative resist composition described above is first applied to a substrate using a spinner or the like, a prebake is then conducted under temperature conditions of 80 to 150° C. for 40 to 120 seconds, preferably for 60 to 90 seconds, followed by selective exposure of the thus obtained film with an ArF exposure apparatus or the like, by irradiating ArF excimer laser light through a desired mask pattern, and then PEB (post exposure baking) is conducted under temperature conditions of 80 to 150° C. for 40 to 120 seconds, preferably for 60 to 90 seconds. Subsequently, a developing treatment is conducted using an alkali developing solution such as a 0.1 to 10% by weight aqueous solution of tetramethylammonium hydroxide. In this manner, a resist pattern that is faithful to the mask pattern can be obtained.

As the substrate, for example, a silicon wafer is used. Inorganic substrates, which equip a layer composed of SiON, SiN or the like, can be also used. An organic or inorganic antireflection film may be provided between the substrate and the film of the resist composition.

There is no particular restriction on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. The negative resist composition of the present invention is particularly effective to ArF excimer lasers.

The polymer compound, the negative resist composition including the polymer compound, and the resist pattern-forming method of the present invention enable a resist pattern with an excellent resolution to be formed. The reason of obtaining the effect is speculated as follows.

The structural unit (a0) included in the polymer compound of the present invention is the unit in which the hydroxyl group is bonded with the alkyl group that is connected through the ether group (—O—) with the 3-position of the adamantyl group, different from a conventional structural unit in which a hydroxyl group is directly bonded with the tertiary carbon atom at the 3-position of the adamantyl group. Therefore, it is thought that, when a resist pattern is formed, the cross-linking agent component (C) is easily bonded with the hydroxyl group connected with the alkyl group, and thus the cross-linking reaction is more likely to be caused between the component (A) and the component (C).

Presumably, this leads to improved alkali insolubility of the resist composition at the exposed site, and a resist pattern with excellent resolution can be formed.

Moreover, in the present invention, a problem that the corner portion of the resist pattern becomes round by the development treatment (so-called thickness loss) is suppressed, and thus a resist pattern with good rectangular shape can be formed.

EXAMPLES

Next, the present invention will now be described in more detail with reference to examples, but the scope of the present invention is not limited to the following examples. The term "%" represents "% by mass", if not otherwise specified.

Monomers used for the synthesis of the polymer compound (resin component (A)) in Examples 1 to 13, and Comparative Example 1 are shown below.

NBHFAA: a monomer represented by a chemical formula shown below (norbornene hexafluoroalcohol acrylate).

[Formula 16]

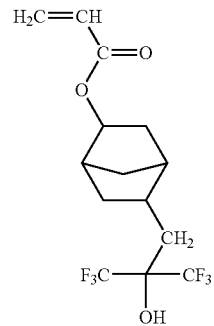

HEMA: a monomer represented by a chemical formula shown below (hydroxyethyl methacrylate).

[Formula 17]

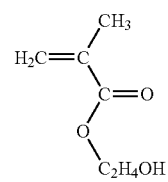

HAdA: a monomer represented by a chemical formula shown below (3-hydroxy-1-adamantyl acrylate).

[Formula 18]

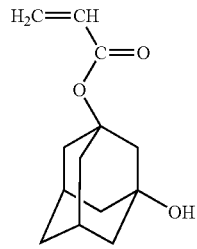

EGHA: a monomer represented by a chemical formula shown below (3-(2-hydroxyethoxy)-1-adamantyl acrylate).

[Formula 19]

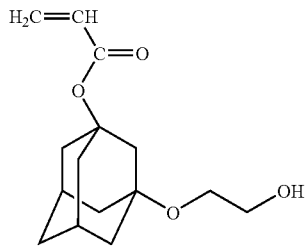

EGHM: a monomer represented by a chemical formula shown below (3-(2-hydroxyethoxy)-1-adamantyl methacrylate).

[Formula 20]

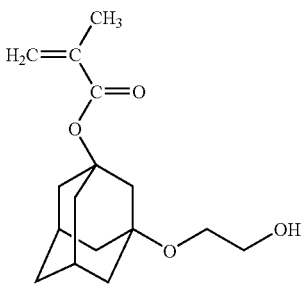

GLHA: a mixture of monomers which contains a monomer represented by a chemical formula shown below.

[Formula 21]

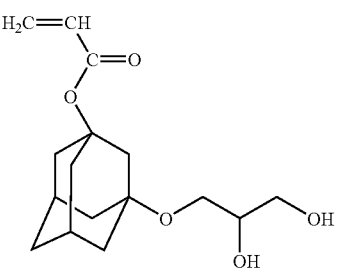

In the examples of the present invention, the term "GLHA" represents a mixture of 3-(2,3-dihydroxy-1-propyloxy)-1-adamantyl acrylate (compound 3) and 3-(1,3-dihydroxy-2-propyloxy)-1-adamantyl acrylate (compound 4) shown below in Synthesis Example 3. Here, the mass ratio of compound 3:compound 4 is 73.7:26.3. When "GLHA" is shown as a chemical formula, the chemical formula of the compound 3 is used as the representative, as shown above. The amount of "GLHA" is represented by the quantity of the mixture of the compounds 3 and 4.

GLHM: a mixture of monomers which contains a monomer represented by a chemical formula shown below.

[Formula 22]

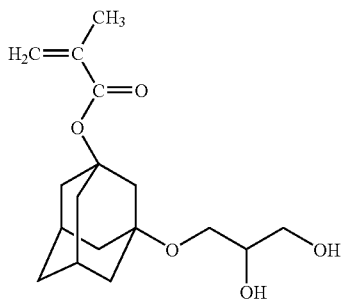

In the examples of the present invention, the term "GLHM" represents a mixture of 3-(2,3-dihydroxy-1-propyloxy)-1-adamantyl methacrylate (compound 7) and 3-(1,3-dihydroxy-2-propyloxy)-1-adamantyl methacrylate (compound 8) shown below in Synthesis Example 6. Here, the mass ratio of compound 7:compound 8 is 76.1:23.9. When "GLHM" is shown as a chemical formula, the chemical formula of the compound 7 is used as the representative, as shown above. The amount of "GLHM" is represented by the quantity of the mixture of the compounds 7 and 8.

Synthesis Examples 1 to 6

A method of synthesizing EGHA, GLHA, EGHM and GLHM of the monomers will be described below.

In the following synthesis examples, nuclear magnetic resonance spectroscopy (NMR) measurements were conducted using a JNM-AL400 apparatus (product name, resolution: 400 MHz) manufactured by JEOL Ltd. Also, gas chromatography-mass spectrography (CC-MS) measurements were conducted using a GCMS-QP2010 manufactured by Shimazu corporation, and differential scanning calorimetry (DSC) measurements were conducted using a DSC6200 manufactured by Seiko Instruments Inc.

Synthesis Example 1

Synthesis of 3-methanesulfonyloxy-1-adamantyl Acrylate (Compound 1)

A stirrer and a dropping funnel were equipped with a 3 L-glass reactor. Then, 222.3 g (1.0 mol) of Adamantate HA (manufactured by Idemitsu Kosan Co., Ltd.: 3-hydroxy-1-adamantyl acrylate), 151.8 g (1.5 mol) of dried triethylamine, and 2,000 mL of dried toluene were added into the glass reactor, and were stirred at 0° C. in an ice bath. Subsequently, 137.5 g (1.2 mol) of methanesulfonyl chloride was added thereto, and was stirred for 5 minutes. As a result of conducting gas chromatography-mass spectrography analysis, it was confirmed that the peak of the adamantate HA was completely disappeared. Subsequently, 100 mL of water was added into it, thereby unreacted methanesulfonyl chloride was deactivated. The reaction solution thus obtained was transferred to a 4 L-separating funnel, 800 mL of water was further added, and then the reaction solution was sufficiently stirred. After leaving at rest, the aqueous layer was removed. To remove the triethylamine, 500 mL of 0.5 N hydrochloric acid was added, and stirred. After leaving at rest, the aqueous layer was removed. Furthermore, an organic layer was washed using an aqueous saturated sodium hydrogen carbonate and an aqueous saturated sodium chloride. This organic layer was transferred to a conical flask, and 12.0 g (0.1 mol) of anhydrous magnesium sulfate was added. The magnesium sulfate was removed by filtration after being dried. Then, the toluene was distilled away from the filtrate by evaporation. As a result of conducting GC analysis, it was confirmed that compound 1 (chemical formula shown below) having purity of 95.4% was obtained (yield 301.6 g).

[Formula 23]

Compound 1

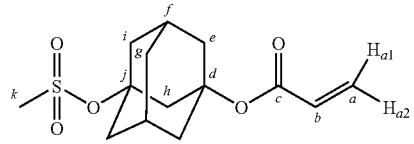

The resulting data of $^1$H-NMR, $^{13}$C-NMR and GC-MS of the compound 1 are as follows:

Nuclear Magnetic Resonance Spectroscopy (NMR):
CDCl$_3$ $^1$H-NMR (500 MHz): 1.57 (s, 2H), 2.03 to 2.23 (8H), 2.40 (br-s, 2H), 2.59 (s, 2H), 2.98 (s, 3H, k), 5.74 (dd, J=1.6, 10.7 Hz, 1H, a2), 6.00 (dd, J=10.7, 17.6 Hz, 1H, b), 6.29 (dd, J=1.6, 17.6 Hz, 1H, a1).

$^{13}$C-NMR (127 MHz): 31.56 (f), 34.33 (g), 39.58 (e or i), 41.00 (k), 41.77 (e or i), 46.69 (h), 80.78 (d or j), 90.31 (d or j), 129.85 (b), 130.23 (a), 165.04 (c).

Gas Chromatography-Mass Spectrography (GC-MS): EI 300 (M$^+$, 2.26%), 228 (23.57%), 204 (39.50%), 186 (9.21%), 149 (64.73%), 133 (39.40%), 121 (14.96%), 105 (52.85%), 92 (53.41%), 79 (38.36%), 67 (13.38%), 55 (100%).

Synthesis Example 2

Synthesis of 3-(2-hydroxyethoxy)-1-adamantyl Acrylate (Compound 2)

A stirrer, a cooling pipe, a dropping funnel, and a thermometer were equipped with a 3 L-glass reactor. Then, 1,500 mL of dried ethyleneglycol, 121.4 g (1.2 mol) of dried triethylamine, and 300 mg of p-methoxyphenol were added into the glass reactor, and were heated at 80° C. in an oil bath. The compound 1 obtained in the Synthesis Example 1 was dropped therein, and the heating was continued. 3 hours after fishing the dropping of the component 1, it was confirmed using GC analysis that the peak of the component 1 was completely disappeared. Then, 600 mL of pure water was added, thereby stopping the reaction. After the reaction solution was cooled at 30° C. or less, it was transferred to a 5 L-separating funnel, 900 mL of pure water was further added, and then extraction by ethyl acetate was performed. Subsequently, the organic layer was washed using a 0.1 N hydrochloric acid, an aqueous saturated sodium hydrogen carbonate, and a saturated sodium chloride solution. After the organic layer was separated, anhydrous magnesium sulfate was added, thereby drying the organic layer. After filtering the magnesium sulfate, the ethyl acetate was distilled away from the filtrate by evaporation, thereby obtaining compound 2 (chemical formula shown below) (yield 247.1 g, (yielding ratio 92.8%), purity 97.1% (GC)).

[Formula 24]

Compound 2

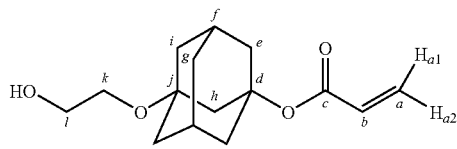

The resulting data of $^1$H-NMR, $^{13}$C-NMR and GC-MS of the compound 2 are as follows:

Nuclear Magnetic Resonance Spectroscopy (NMR):

CDCl$_3$ $^1$H-NMR (500 MHz): 1.46 to 1.61 (2H), 1.64 to 1.72 (2H), 1.72 to 1.81 (2H), 1.99 to 2.20 (6H), 2.23 (1H), 2.33 (2H), 3.51 (2H, k or l), 3.66 (2H, k or l), 5.71 (dd, J=1.6, 10.7 Hz, 1H, a2), 6.00 (dd, J=10.7, 17.6 Hz, 1H, b), 6.27 (dd, J=1.6, 17.6 Hz, 1H, a1).

$^{13}$C-NMR (127 MHz): 31.01 (f), 35.12 (g), 40.26 (e or i), 40.58 (e or i), 45.34 (h), 61.59 (l or k), 62.27 (l or k), 74.43 (d or j), 81.55 (d or j), 129.80 (O), 130.19 (a), 165.23 (c).

Gas Chromatography-Mass Spectrography (GC-MS): EI 266 (M$^+$, 0.27%), 205 (61.43%), 194 (32.68%), 133 (38.74%), 93 (13.99%), 79 (11.59%), 55 (100%).

Synthesis Example 3

Synthesis of 3-(2,3-dihydroxy-1-propyloxy)-1-adamantyl Acrylate (Compound 3) and 3-(1,3-dihydroxy-2-propyloxy)-1-adamantyl Acrylate (Compound 4)

A stirrer, a cooling pipe, a dropping funnel, and a thermometer were equipped with a 3 L-glass reactor. Then, 1,000 mL of dried glycerol, 121.4 g (1.2 mol) of dried triethylamine, and 300 mg of p-methoxyphenol were added into the glass reactor, and were heated at 80° C. in an oil bath.

The compound 1 obtained in the Synthesis Example 1 was dissolved in 333 mL of 1,2-dimethoxyethane, and the dissolved compound 1 was dropped into the reactor, while the heating was continued. 4 hours after finishing the dropping of the dissolved component 1, it was confirmed using GC analysis that the peak of the component 1 was completely disappeared. Then, 600 mL of pure water was added, thereby stopping the reaction. After the reaction solution was cooled at 30° C. or less, it was transferred to a 5 L-separating funnel, 1,000 mL of pure water was further added, and then extraction by ethyl acetate was performed. Subsequently, the organic layer was washed using a 0.1 N hydrochloric acid, an aqueous saturated sodium hydrogen carbonate, and a saturated sodium chloride solution. After the organic layer was separated, anhydrous magnesium sulfate was added, thereby drying the organic layer. After filtering the magnesium sulfate, the ethyl acetate was distilled away from the filtrate by evaporation, thereby obtaining a mixture of the compounds 3 and 4 (mass ratio of compound 3:compound 4 is 73.7:26.3) (chemical formulae shown below) (yield 269.4 g, (yield ratio 90.9%), purity 97.3% (GC)).

[Formula 25]

Compound 8

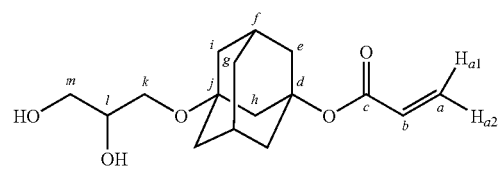

Compound 4

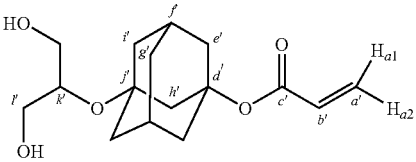

The data of $^1$H-NMR, $^{13}$C-NMR and GC-MS of the compounds 3 and 4 are as follows:

Nuclear Magnetic Resonance Spectroscopy (NMR):

CDCl$_3$ $^1$H-NMR (500 MHz): 1.40 to 1.57 (2H), 1.58 to 1.78 (4H), 1.93 to 2.18 (6H), 2.29 (br-s, 1H), 2.73 to 3.32 (3H), 3.38 to 3.82 (5H), 5.69 (m, 1H, a2), 5.97 (m, 1H, b), 6.24 (m, 1H, a1).

$^{13}$C-NMR (127 MHz):

(Compound 3) 30.96 (f), 35.04 (g), 40.20 (e or i), 40.39 (e or i), 45.19 (h), 62.37 (k or m), 64.27 (k or m), 70.92 (l), 74.67 (d or j), 81.51 (d or j), 129.87 (b), 130.11 (a), 165.25 (c).

(Compound 4) 31.62 (f), 34.94 (g'), 39.94 (e' or i'), 41.37 (e' or i'), 46.09 (h'), 63.62 (l'), 70.12 (k'), 75.55 (d' or j'), 81.41 (d' or j'), 129.95 (b'), 130.11 (a'), 165.25 (c').

Gas Chromatography-Mass Spectrography (GC-MS): EI
(Compound 3) 205 (69.62%), 151 (26.75%), 134 (47.69%), 133 (44.63%), 93 (14.40%), 79 (10.23%), 55 (100%).
(Compound 4) 205 (97.68%), 133 (43.08%), 91 (10.29%), 55 (100%).

Synthesis Example 4

Synthesis of 3-methanesulfonyloxy-1-adamantyl Methacrylate (Compound 5)

Synthesis Example 4 was conducted in the same manner as Synthesis Example 1, with the exception of using 236.3 g (1.0 mol) of Adamantate HM (manufactured by Idemitsu Kosan Co., Ltd.: 3-hydroxy-1-adamantyl methacrylate) instead of 222.3 g (1.0 mol) of Adamantate HA (manufactured by Idemitsu Kosan Co., Ltd.: 3-hydroxy-1-adamantyl acrylate). Then, it was confirmed that 302.2 g of a white solid of compound 5 (chemical formula shown below) was obtained (yield ratio 96.1%, GC purity 99.4%).
[Formula 26]

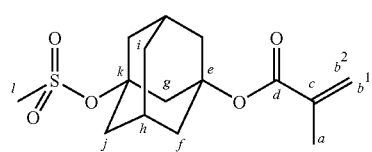

Compound 5

The data of $^1$H-NMR, $^{13}$C-NMR and GC-MS of the compound 5 are as follows:

Nuclear Magnetic Resonance Spectroscopy (NMR):
CDCl$_3$ $^1$H-NMR (500 MHz): 1.59 (br-s, 2H), 1.89 (s, 3H, a), 2.09 (d, J=12.2 Hz, 2H), 2.18 (d, J=12.2 Hz, 2H), 2.22 (d, J=3.1 Hz, 4H), 2.42 (br-s, 2H), 2.62 (s, 2H, g), 3.01 (s, 3H, l), 5.51 (t, J=1.5 Hz, 1H, b1), 6.02 (s, 1H, b2).
$^{13}$C-NMR (127 MHz): 18.23 (a), 31.46 (h), 34.26 (g or i), 39.44 (f or j), 40.88 (l), 41.70 (j or f), 46.57 (i or g), 80.53 (k), 90.30 (e), 125.02 (b), 137.37 (c), 166.15 (d).

Gas Chromatography-Mass Spectrography (GC-MS): EI
315 (M$^+$+1, 2.4%), 133 (M$^+$, 14.4%), 229 (29.0%), 228 (65.0%), 149 (96.8%), 132 (27.4%), 133 (95.7%), 121 (20.6%), 107 (23.8%), 105 (87.4%), 93 (44.3%), 92 (71.0%), 91 (56.0%), 79 (38.7%), 69 (100%).
Melting Point (° C., Differential Scanning Calorimetry (DSC) method): 31.3 to 35.5° C.

Synthesis Example 5

Synthesis of 3-(2-hydroxyethoxy)-1-adamantyl Methacrylate (Compound 6)

A stirrer was equipped with a 2 L-glass reactor, and the compound 5 (151.1 g) obtained by the method of Synthesis Example 4 was added thereto. Then, 1,100 mL (19.7 mol) of dried ethyleneglycol, 76.0 mL (545 mmol) of dried triethylamine were added into the glass reactor, and stirred.
Subsequently, the temperature of an oil bath was set at 80° C., and the reactor was heated for 2 hours. As a result of conducting GC analysis, it was found that a specific substance having an inversion rate of 99.9% and a selection rate of 99.8% was obtained. Subsequently, the reaction solution was transferred to a 2 L-separating funnel, 600 mL of diethylether and 200 mL of water were added, extraction of the organic layer was conducted, then an 1 N dilute hydrochloric acid was added thereby washing the solution, 700 mL of pure water was further added thereby washing the solution, and consequently the triethylamine was removed. 12.0 g (100 mmol) of anhydrous magnesium sulfate was added, thereby drying the solution. Then, the solution was filtrated, thereby removing magnesium sulfate.

The diethylether was removed from the solution thus obtained by evaporation. By a recrystallization treatment, a white solid (compound 6, chemical formula shown below) was obtained (yield 91.96 g (yield ratio 68.2%), purity 99.5% (GC), 99.4% (GPC)).
[Formula 27]

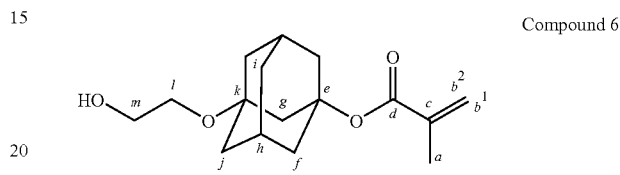

Compound 6

The resulting data of $^1$H-NMR, $^{13}$C-NMR and GC-MS of the compound 6 are as follows:

Nuclear Magnetic Resonance Spectroscopy (NMR):
CDCl$_3$ $^1$H-NMR (500 MHz): 1.52 (d, J=12.8 Hz, 2H), 1.60 (d, J=12.8 Hz, 2H), 1.70 (d, J=11.3 Hz, 2H), 1.78 (d, J=11.3 Hz, 2H), 1.89 (s, 3H, a), 2.05 (d, J=11.3 Hz, 2H), 2.13 (d, J=11.2 Hz, 2H), 2.17 (s, 2H, g), 2.36 (br-s, 2H), 2.48 (q, J=4.0 Hz, 1H), 3.54 (t, J=4.6 Hz, 2H, l), 3.68 (q, J=5.0 Hz, 2H, m), 5.49 (q, J=1.5 Hz, b1), 5.96 (s, b2).
$^{13}$C-NMR (127 MHz): 18.18 (a), 30.84 (h), 34.97 (i), 40.04 (f or j), 40.40 (j or f), 45.11 (g), 61.48 (l or m), 62.06 (m or l), 74.28 (k), 81.19 (e), 124.54 (b), 137.59 (c), 166.28 (d).

Gas Chromatography-Mass Spectrography (CC-MS): EI
281 (M$^+$+1, 0.02%), 280 (M$^+$, 0.16%), 263 (0.05%), 262 (0.26%), 220 (11.0%), 219 (40.3%), 195 (8.7%), 194 (37.1%), 134 (24.0%), 133 (21.7%), 69 (100%).
Melting Point (° C., DSC method): 50.0 to 54.5° C.

Synthesis Example 6

Synthesis of 3-(2,3-dihydroxy-1-propyloxy)-1-adamantyl Methacrylate (Compound 7) and 3-(1,3-dihydroxy-2-propyloxy)-1-adamantyl Methacrylate (Compound 8)

Synthesis Example 6 was conducted in the same manner as Synthesis Example 3, with the exception of using the compound 5 (151.1 g) obtained by the method described in the Synthesis Example 4, instead of the compound 1. As a result, a mixture of the compound 7 and 8 (mass ratio of compound 7:compound 8 was 76.1:23.9) was obtained (yield 138.6 g (yield ratio 92.9%), purity 98.9% (GC)).
[Formula 28]

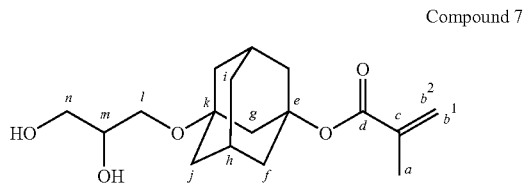

Compound 7

-continued

Compound 8

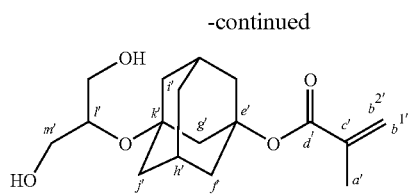

The resulting data of $^1$H-NMR, $^{13}$C-NMR and GC-MS of the compounds 7 and 8 are as follows:

Nuclear Magnetic Resonance Spectroscopy (NMR):
CDCl$_3$ $^1$H-NMR (500 MHz): 1.45-1.56 (21H), 1.63-1.76 (4H), 1.84 (s, 3H, a), 1.98-2.14 (6H), 2.31 (s, 2H), 3.42-3.80 (m, 5H, 1-n), 5.45 (s, b$^1$), 5.96 (s, b$^2$).
$^{13}$C-NMR (127 MHz):
(Compound 7) 18.35 (a), 30.98 (h), 35.08 (i), 40.18 (f), 40.42, 40.44, 45.18 (g), 62.43 (1 or n), 64.31 (1 or n), 70.86 (m), 74.72 (k), 81.32 (e), 124.78 (b), 137.72 (c), 166.46 (d).
(Compound 8) 15.30 (a'), 30.98 (h'), 34.98 (i'), 40.08 (f'), 41.45 (j'), 46.08 (g'), 63.68 (l' or n'), 65.89 (l' or n'), 70.07 (m'), 75.58 (k'), 81.20 (e'), 124.86 (l'), 137.68 (c'), 166.46 (d').

Gas Chromatography-Mass Spectrography (GC-MS): EI
(Compound 7) 279 M$^+$-CH$_2$OH, 1.2%), 220 (11.9%), 219 (46.0%), 151 (19.2%), 134 (49.6%), 133 (20.0%), 117 (10.4%), 93 (10.6%), 69 (100%), 41 (26.4%).
(Compound 8) 280 (1.8%), 220 (5.7%), 219 (32.6%), 151 (6.1%), 134 (31.6%), 133 (19.5%), 117 (38.5%), 116 (15.9%), 69 (100%), 41 (23.9%).

Examples 1 to 13 and Comparative Example 1

Using the monomers described above, polymer compounds (resin components (A)) shown below in Examples 1 to 13 and Comparative Example 1 were synthesized. The composition ratio (molar ratio) of the monomers in the resin components (A), mass average molecular weight (Mw), and dispersion degree (Mw/Mn) are shown in Table 1.

Example 1

Synthesis of Resin (A-1)

12.68 g of NBHFAA, 2.61 g of EGHM, and 0.32 g of azobisisodimethyl butyrate (V-601, manufactured by Wako Pure Chemical Industries, Ltd.) serving as a polymerization initiator were dissolved in 130 ml of THF (tetrahydrofuran).
Subsequently, a nitrogen bubbling treatment was conducted for about 10 minutes, the resultant was stirred for 4 hours in an oil bath of 70° C., and then cooled to room temperature. Next, the reaction solution was concentrated using an evaporator and then the concentrated solution was dissolved in 60 ml of THF and added into 1,000 ml of heptane, thereby extracting and filtering a resin. The resin thus obtained was dried using a drier at 40° C. for 24 hours, thereby obtaining 9.95 g of a white solid.
The resin thus obtained is shown below in a chemical formula (A-1).
The mass average molecular weight (Mw) was 7,000, the dispersion degree (Mw/Mn) was 1.57, and the composition ratio of monomers (molar ratio) was

[Formula 29]

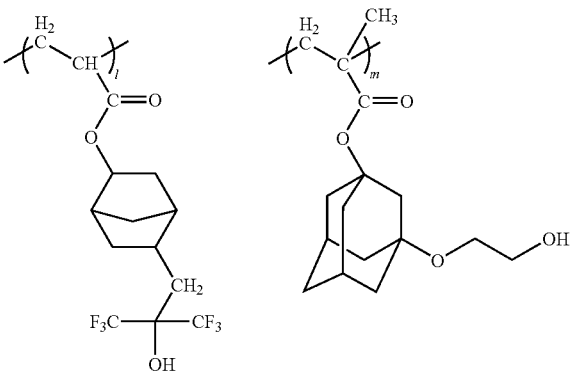

(A-1)

Example 2

Synthesis of Resin (A-2)

12.68 g of NBHFAA, 2.89 g of GLHM, and 0.32 g of azobisisodimethyl butyrate serving as a polymerization initiator were dissolved in 130 ml of THF (tetrahydrofuran).
Subsequently, a nitrogen bubbling treatment was conducted for about 10 minutes and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 12.2 g of a white solid.
The resin thus obtained is shown below in a chemical formula (A-2).
The mass average molecular weight (Mw) was 6,500, the dispersion degree (Mw/Mn) was 1.70, and the composition ratio of monomers (molar ratio) was "l/m=80/20".

[Formula 30]

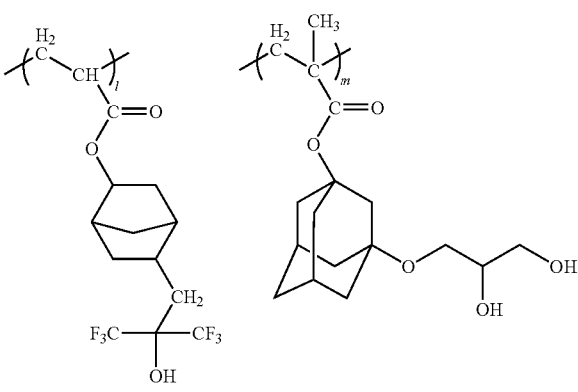

(A-2)

Example 3

Synthesis of Resin (A-3)

9.51 g of NBHFAA, 5.78 g of GLHM, and 0.32 g of azobisisodimethyl butyrate serving as a polymerization initiator were dissolved in 130 ml of THF (tetrahydrofuran).

Subsequently, a nitrogen bubbling treatment was conducted for about 10 minutes and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 13.2 g of a white solid.

The resin thus obtained is the same as the chemical formula (A-2).

The mass average molecular weight (Mw) was 8,100, the dispersion degree (Mw/Mn) was 2.17, and the composition ratio of monomers (molar ratio) was "l/m=60/40".

Example 4

Synthesis of resin (A-4)

12.68 g of NBHFAA, 2.48 g of EGHA, and 0.32 g of azobisisodimethyl butyrate serving as a polymerization initiator were dissolved in 130 ml of THF (tetrahydrofuran).

Subsequently, a nitrogen bubbling treatment was conducted for about 10 minutes and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 13.3 g of a white solid.

The resin thus obtained is shown below in a chemical formula (A-4).

The mass average molecular weight (Mw) was 4,000, the dispersion degree (Mw/Mn) was 1.44, and the composition ratio of monomers (molar ratio) was "l/m=80/20".

[Formula 31]

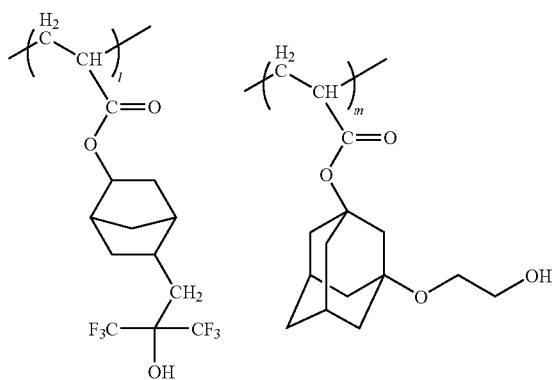

(A-4)

Example 5

Synthesis of Resin (A-5)

9.51 g of NBHFAA, 4.96 g of EGHA, and 0.32 g of azobisisodimethyl butyrate serving as a polymerization initiator were dissolved in 130 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 10.0 g of a white solid.

The resin thus obtained is the same as the chemical formula (A-4).

The mass average molecular weight (Mw) was 4,000, the dispersion degree (Mw/Mn) was 1.64, and the composition ratio of monomers (molar ratio) was "l/m=60/40".

Example 6

Synthesis of Resin (A-6)

12.68 g of NBHFAA, 2.48 g of EGHA, and 0.32 g of azobisisodimethyl butyrate serving as a polymerization initiator were dissolved in 80 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 12.9 g of a white solid.

The resin thus obtained is the same as the chemical formula (A-4).

The mass average molecular weight (Mw) was 5,700, the dispersion degree (Mw/Mn) was 1.59, and the composition ratio of monomers (molar ratio) was "l/m=80/20".

Example 7

Synthesis of Resin (A-7)

11.09 g of NBHFAA, 3.72 g of EGHA, and 0.32 g of azobisisodimethyl butyrate serving as a polymerization initiator were dissolved in 80 ml of THF (tetrahydrofuran).

Subsequently, a nitrogen bubbling treatment was conducted for about 10 minutes and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 9.93 g of a white solid.

The resin thus obtained is the same as the chemical formula (A-4).

The mass average molecular weight (Mw) was 5,800, the dispersion degree (Mw/Mn) was 1.61, and the composition ratio of monomers (molar ratio) was "l/m=70/30".

Example 8

Synthesis of Resin (A-8)

9.51 g of NBHFAA, 4.96 g of EGHA, and 0.32 g of azobisisodimethyl butyrate serving as a polymerization initiator were dissolved in 80 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 12.6 g of a white solid.

The resin thus obtained is the same as the chemical formula (A-4).

The mass average molecular weight (Mw) was 5,100, the dispersion degree (Mw/Mn) was 1.76, and the composition ratio of monomers (molar ratio) was "l/m=60/40".

Example 9

Synthesis of Resin (A-9)

12.68 g of NBHFAA, 2.76 g of GLHA, and 0.32 g of azobisisodimethyl butyrate serving as a polymerization initiator were dissolved in 70 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 14.4 g of a white solid.

The resin thus obtained is shown below in a chemical formula (A-9).

The mass average molecular weight (Mw) was 6,000, the dispersion degree (Mw/Mn) was 1.70, and the composition ratio of monomers (molar ratio) was "l/m=80/20".

[Formula 32]

(A-9)

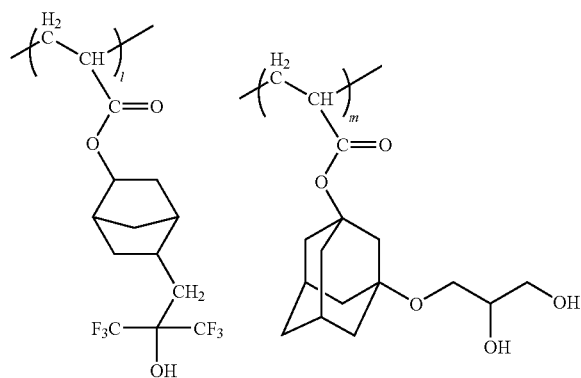

Example 10

Synthesis of Resin (A-10)

11.09 g of NBHFAA, 4.14 g of GLHA, and 0.32 g of azobisisodimethyl butyrate serving as a polymerization initiator were dissolved in 70 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 13.85 g of a white solid.

The resin thus obtained is the same as the chemical formula (A-9).

The mass average molecular weight (Mw) was 6,800, the dispersion degree (Mw/Mn) was 1.84, and the composition ratio of monomers (molar ratio) was "l/m=70/30".

Example 11

Synthesis of Resin (A-11)

9.51 g of NBHFAA, 5.52 g of GLHA, and 0.32 g of azobisisodimethyl butyrate serving as a polymerization initiator were dissolved in 70 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 75 ml of THF and added into 2,000 ml of heptane, thereby extracting and filtering a resin. The resin thus obtained was dried using a drier at 40° C. for 24 hours, thereby obtaining 14.5 g of a white solid.

The resin thus obtained is the same as the chemical formula (A-9).

The mass average molecular weight (Mw) was 5,400, the dispersion degree (Mw/Mn) was 1.88, and the composition ratio of monomers (molar ratio) was "l/m=60/40".

Example 12

Synthesis of Resin (A-12)

10.33 g of NBHFAA, 1.32 g of HEMA, 5.39 g of EGHA, and 0.45 g of azobisisodimethyl butyrate serving as a polymerization initiator were dissolved in 150 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 100 ml of THF and added into 2,000 ml of heptane, thereby extracting and filtering a resin. The resin thus obtained was dried using a drier at 40° C. for 24 hours, thereby obtaining 13.2 g of a white solid.

The resin thus obtained is shown below in a chemical formula (A-12).

The mass average molecular weight (Mw) was 5,500, the dispersion degree (Mw/Mn) was 1.82, and the composition ratio of monomers (molar ratio) was l/m/n=50/33/17.

[Formula 33] (A-12)

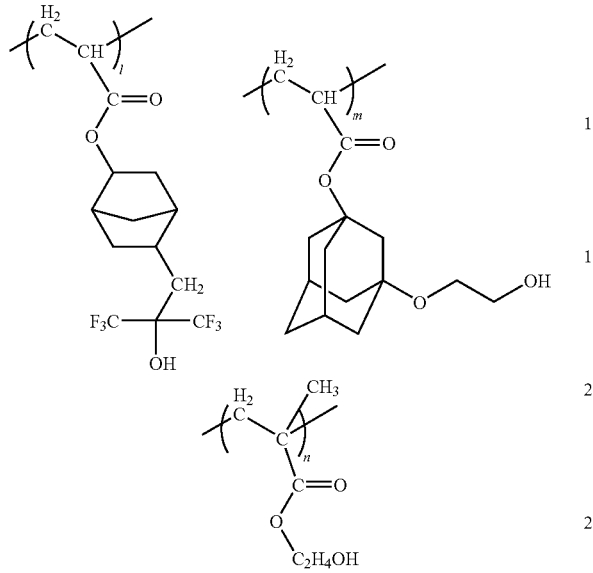

Example 13

Synthesis of Resin (A-13)

10.33 g of NBHFAA, 1.32 g of HEMA, 6.00 g of GLHA, and 0.45 g of azobisisodimethyl butyrate serving as a polymerization initiator were dissolved in 135 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 100 ml of THF and added into 2,000 ml of heptane, thereby extracting and filtering a resin. The resin thus obtained was dried using a drier at 40° C. for 24 hours, thereby obtaining 14.8 g of a white solid.

The resin thus obtained is shown below in a chemical formula (A-13).

The mass average molecular weight (Mw) was 6,000, the dispersion degree (Mw/Mn) was 1.91, and the composition ratio of monomers (molar ratio) was "l/m/n=50/33/17".

[Formula 34] (A-13)

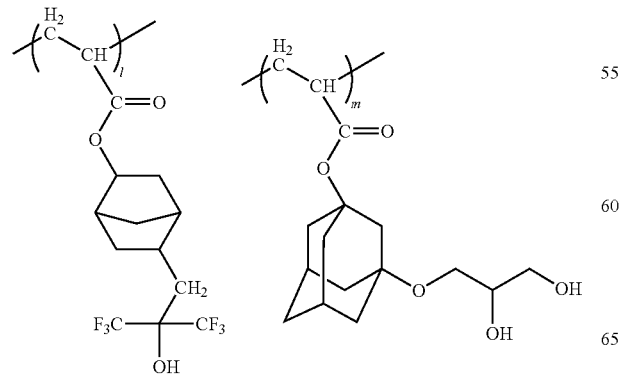

-continued

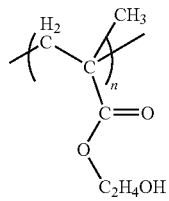

Comparative Example 1

Synthesis of Resin (A-14)

12.25 g of NBHFAA, 2.0 g of HAdA, and 0.33 g of azobisisodimethyl butyrate serving as a polymerization initiator were dissolved in 70 ml of THF (tetrahydrofuran).

Subsequently, a nitrogen bubbling treatment was conducted for about 10 minutes, and the resultant was stirred for 4 hours while elevating the temperature using an oil bath at 70° C. Then, it was cooled to room temperature. Next, the reaction solution was concentrated using an evaporator and then the concentrated solution was dissolved in 100 ml of THF and added into 2,000 ml of heptane, thereby extracting and filtering a resin. The resin thus obtained was dried using a drier at 40° C. for 24 hours, thereby obtaining 8.45 g of a white solid.

The resin thus obtained is shown below in a chemical formula (A-14).

The mass average molecular weight (Mw) was 6,700, the dispersion degree (Mw/Mn) was 1.67, and the composition ratio of monomers (molar ratio) was "l/m=80/20".

[Formula 35] (A-14)

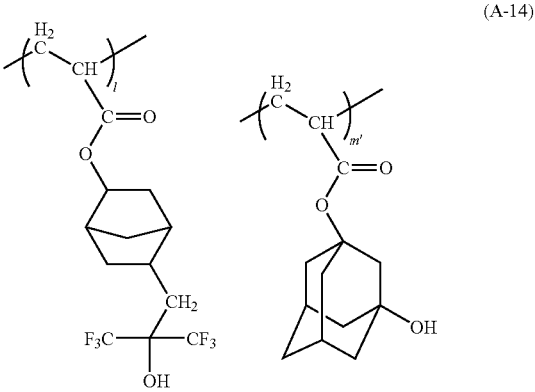

TABLE 1

| | | l | m | | | | | | m' | | |
| | (A) | NBHFAA | EGHM | GLHM | EGHA | GLHA | HEMA | HAdA | Mw | Mw/Mn |
|---|---|---|---|---|---|---|---|---|---|---|
| Example 1 | (A-1) | 80 | 20 | — | — | — | — | — | 7000 | 1.57 |
| Example 2 | (A-2) | 80 | — | 20 | — | — | — | — | 6500 | 1.70 |
| Example 3 | (A-3) | 60 | — | 40 | — | — | — | — | 8100 | 2.17 |
| Example 4 | (A-4) | 80 | — | — | 20 | — | — | — | 4000 | 1.44 |
| Example 5 | (A-5) | 60 | — | — | 40 | — | — | — | 4000 | 1.64 |
| Example 6 | (A-6) | 80 | — | — | 20 | — | — | — | 5700 | 1.59 |
| Example 7 | (A-7) | 70 | — | — | 30 | — | — | — | 5800 | 1.61 |
| Example 8 | (A-8) | 60 | — | — | 40 | — | — | — | 5100 | 1.76 |
| Example 9 | (A-9) | 80 | — | — | — | 20 | — | — | 6000 | 1.70 |
| Example 10 | (A-10) | 70 | — | — | — | 30 | — | — | 6800 | 1.84 |
| Example 11 | (A-11) | 60 | — | — | — | 40 | — | — | 5400 | 1.88 |
| Example 12 | (A-12) | 50 | — | — | 33 | — | 17 | — | 5500 | 1.82 |
| Example 13 | (A-13) | 50 | — | — | — | 33 | 17 | — | 6000 | 1.91 |
| Comparative Example 1 | (A-14) | 80 | — | — | — | — | — | 20 | 6700 | 1.67 |

Examples 14 to 18 and Comparative Example 2

A negative resist composition was prepared by mixing and dissolving each component represented below in Table 2.

TABLE 2

| | (A) | (B) | (C) | (D) | (S) |
|---|---|---|---|---|---|
| Example 14 | (A-6) [100] | (B)-1 [1.5] | (C)-1 [5.0] | (D)-1 [0.3] | (S)-1 [1150] |
| Example 15 | (A-7) [100] | (B)-1 [1.5] | (C)-1 [5.0] | (D)-1 [0.3] | (S)-1 [1150] |
| Example 16 | (A-9) [100] | (B)-1 [1.5] | (C)-1 [5-0] | (D)-1 [0.3] | (S)-1 [1150] |
| Example 17 | (A-10) [100] | (B)-1 [1.5] | (C)-1 [5.0] | (D)-1 [0.3] | (S)-1 [1150] |
| Example 18 | (A-2) [100] | (B)-1 [1-5] | (C)-1 [5.0] | (D)-1 [0.3] | (S)-1 [1150] |
| Comparative Example 2 | (A-14) [100] | (B)-1 [1.5] | (C)-1 [5.0] | (D)-1 [0.3] | (S)-1 [1150] |

In Table 2, the meanings of the abbreviations are described below. Also, the values within the brackets [ ] represent the blending amount (parts by weight).
(B)-1: triphenylsulfoniumtrifluoromethane sulfonate
(C)-1: tetramethoxymethylated glycoluril MX270 (product name, manufactured by Sanwa Chemical Co., Ltd.)
D)-1: triisopropanolamine
(S)-1: propylene glycol monomethyl ether (PGME)
The following evaluations were performed using the negative resist composition solutions thus obtained.

[Evaluation of Resolution]
First, an organic antireflection film composition "ARC-29" (product name, manufactured by Brewer Science Ltd.) was uniformly applied by a spinner onto a silicon wafer, and sintered and dried at 215° C. for 90 seconds on a hot plate to form an organic antireflection film having a film thickness of 77 nm.
The obtained negative resist composition solution was uniformly applied onto the antireflection film using a spinner, and then conducting a prebake (PAB) treatment on a hot plate at 80° C. for 60 seconds, thereby forming a resist film having a film thickness of 200 nm.
Subsequently, the obtained resist layer was selectively exposed by an ArF excimer laser (193 nm), using an ArF exposure apparatus "NSR-S302" (manufactured by Nikon; numerical aperture (NA)=0.60, ⅔ annual illumination) through a mask pattern (half tone).
Thereafter, a post exposure bake (PEB) treatment was conducted at 100° C. for 60 seconds, followed by a development treatment for 60 seconds at 23° C. in a 2.38 mass % aqueous solution of tetramethylammonium hydroxide (TMA), rinsing with pure water for 20 seconds, and drying, thereby forming a resist pattern.

Using the optimum exposure (sensitivity; Eop) for a line and space pattern (L/S pattern) with a line width of 140 nm and a pitch of 140 nm, the size of the mask pattern was varied, thereby determining the smallest pattern dimensions (nm) for which the resist pattern could be resolved, and evaluating the resolution. The results are shown in Table 3.

TABLE 3

| | PAB (° C.) | PEB (° C.) | Resolution (nm) |
|---|---|---|---|
| Example 14 | 80 | 100 | 120 |
| Example 15 | 80 | 100 | 130 |
| Example 16 | 80 | 100 | 120 |
| Example 17 | 80 | 100 | 130 |
| Example 18 | 80 | 100 | 120 |
| Comparative Example 2 | 80 | 100 | 140 |

From the results shown in Table 3, it was confirmed that the negative resist compositions of Examples 14 to 18 which contained polymer compounds of the present invention could form resist patterns with excellent resolution. Moreover, the resist pattern was observed using scanning electron microscope (SEM). As a result, it was confirmed that a resist pattern with a good rectangular shape could be formed.

On the other hand, in the case of using the negative resist composition of Comparative Example 2, which contained a polymer compound (Comparative Example 1) different from that of the present invention, the resolution was only 140 nm, the resist pattern had a large amount of thickness loss, and the resist pattern shape had a defect.

What is claimed is:
1. A polymer compound, which comprises a structural unit (a0) represented by the general formula (a0-1) shown below and a structural unit (a11) represented by the general formula (1) shown below:

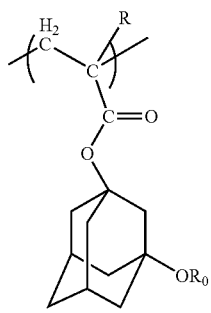

(a0-1)

(wherein, R represents a hydrogen atom, a halogen atom, an alkyl group or a halogenated alkyl group; and $R_0$ represents an alkyl group containing a hydroxyl group),

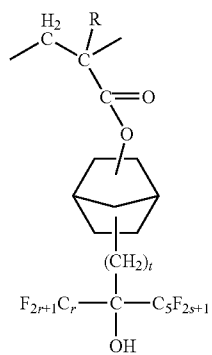

(1)

(wherein, R represents a hydrogen atom, a halogen atom, an alkyl group or a halogenated alkyl group; and r, s and t each independently represent an integer from 1 to 5), wherein the proportion of the structural unit (a0) in the polymer compound is 20 to 30 mol %.

2. The polymer compound according to claim 1, wherein the polymer compound further comprises a structural unit (a320) represented by the general formula (a3-2) shown below:

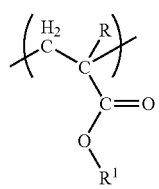

(a3-2)

(wherein, R represents a hydrogen atom, a halogen atom, an alkyl group or a halogenated alkyl group; and $R^1$ represents a hydroxyalkyl group).

3. A negative resist composition, which comprises an alkali soluble resin component (A), an acid generator component (B) which generates an acid upon exposure, and a cross-linking agent (C), wherein the alkali soluble resin component (A) comprises the polymer compound (A1) which contains a structural unit (a0) represented by the general formula (a0-1) shown below and a structural unit (a11) represented by the general formula (1) shown below:

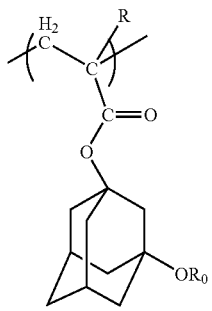

(a0-1)

(wherein, R represents a hydrogen atom, a halogen atom, an alkyl group or a halogenated alkyl group; and $R_0$ represents an alkyl group containing a hydroxyl group),

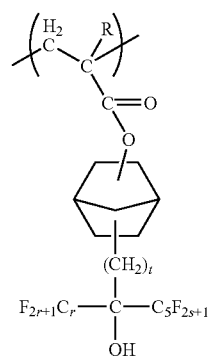

(I)

(wherein, R represents a hydrogen atom, a halogen atom, an alkyl group or a halogenated alkyl group; and r, s and t each independently represent an integer from 1 to 5), wherein, the proportion of the structural unit (a0) in the polymer compound (A1) is 20 to 30 mol %.

4. The negative resist composition according to claim 3, wherein the negative resist composition further comprises a structural unit (a320) represented by the general formula (a3-2) shown below:

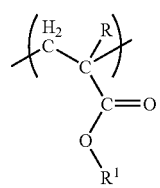

(a 3-2)

(wherein, R represents a hydrogen atom, a halogen atom, an alkyl group or a halogenated alkyl group; and $R^1$ represents a hydroxyalkyl group).

5. The negative resist composition according to claim 3, further comprising a nitrogen-containing organic compound (D).

6. A resist pattern-forming method, comprising:
   forming a resist film on a substrate using the negative resist composition described in any one of claims 3, 4 and 5;

exposing the resist film; and developing the resist film to form a resist pattern.

7. The polymer compound according to claim 2, wherein $R^1$ is a linear hydroxyalkyl group of 2 to 4 carbon atoms.

8. The negative resist composition according to claim 4, wherein $R^1$ is a linear hydroxyalkyl group of 2 to 4 carbon atoms.

* * * * *

UNITED STATES PATENT AND TRADEMARK OFFICE
CERTIFICATE OF CORRECTION

PATENT NO. : 7,820,360 B2
APPLICATION NO. : 12/065990
DATED : October 26, 2010
INVENTOR(S) : Iwashita et al.

It is certified that error appears in the above-identified patent and that said Letters Patent is hereby corrected as shown below:

(Item 56) Page 2 Column 1, Line 9 Under Other Publications, change "Alicylic" to --Alicyclic--.

Column 3, Line 10 (Approx.) Change "(A0-1)." to --(a0-l).--.

Column 3, Line 65 Change ">>Polymer Compound>>" to --<<Polymer Compound>>--.

Column 4, Line 4 Change "allyl" to --alkyl--.

Column 6, Line 1 Change "alicylic" to --alicyclic--.

Column 6, Line 12 Change "bicycloalane," to --bicycloalkane,--.

Column 7, Line 11 Change "mol %" to --mol %,--.

Column 7, Line 50 (Approx.) Change "R'" to --$R^1$--.

Column 15, Lines 60-62 (Approx.) After "groups." delete "$R^{4''}$ represents a linear, branched or cyclic alkyl group or a linear, branched or cyclic fluorinated alkyl group." and insert the same on Col. 15, Line 61 (Approx.) as a new Paragraph.

Column 16, Line 1 Change "$R^{41''}$" to --$R^{4''}$--.

Column 16, Line 6 Change "proportion" to --(proportion--.

Column 16, Line 21 (Approx.) Change "10''''" to --$R^{6''}$--.

Column 16, Line 23 (Approx.) Change "$R^{41''}$" to --$R^{4''}$--.

Column 16, Line 32 (Approx.) Change "thereof" to --thereof,--.

Signed and Sealed this
Twenty-sixth Day of April, 2011

David J. Kappos
*Director of the United States Patent and Trademark Office*

CERTIFICATE OF CORRECTION (continued)
U.S. Pat. No. 7,820,360 B2

Column 16, Line 42 (Approx.) Change "thereof" to --thereof,--.

Column 16, Lines 48-49 (Approx.) Change "trifluoromethansulfonate" to --trifluoromethanesulfonate--.

Column 16, Line 49 (Approx.) Change "naphtyl)" to --naphthyl)--.

Column 16, Line 50 (Approx.) Change "sulfonium" to -- sulfonium,--.

Column 16, Line 53 (Approx.) Change "n-buthanesulfonate," to --n-butanesulfonate,--.

Column 16, Line 60 (Approx.) Change "(b-2)" to --(b-2).--.

Column 19, Line 17 Change "phenantryl" to --phenanthryl--.

Column 20, Lines 29-30 Change "cycloohexenylacetonitrile," to --cyclohexenylacetonitrile,--.

Column 20, Line 34 Change "trifluoromethylsulfonyloxyimo" to --trifluoromethylsulfonyloxyimino--.

Column 20, Line 44 Change "international" to --International--.

Column 21, Lines 56-61 (Approx.) Change " 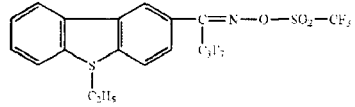 "

to -- 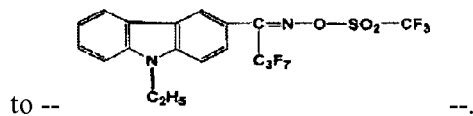 --.

Column 22, Line 47 Change "l,6-bisphenylsulfonyldiazomethylsulfonyl)hexane," to --1,6-bis(phenylsulfonyldiazomethylsulfonyl)hexane,--.

Column 22, Line 48 Change "l,10-bisphenylsulfonyldiazomethylsulfonyl)decane," to --1,10-bis(phenylsulfonyldiazomethylsulfonyl)decane,--.

Column 23, Line 39 (Approx.) Change "alcohol" to --alcohol,--.

Column 24, Line 9 Change "$R^{1}$'" to --$R^{1'}$--.

Column 25, Line 44 Change "component A)" to --component (E)--.

Column 26, Lines 45-48 Below "8:2." delete "Furthermore, in those cases where PGME is added as the polar solvent, the mass ratio PGME:PGME is preferably from 1:9 to 9:1, more preferably 2:8 to 8:2, and still more preferably 3:7 to 7:3." and insert the same on Col. 26, Line 44 after "'8:2." as the

CERTIFICATE OF CORRECTION (continued)
U.S. Pat. No. 7,820,360 B2 continuation of the paragraph.

Column 30, Line 12 Change "(CC-MS)"to --(GC-MS)--.

Column 31, Line 24 (Approx.) Change "fishing" to --finishing--.

Column 31, Line 63 (Approx.) Change "(O),"to --(b),--.

Column 34, Line 37 Change "(CC-MS):" to --(GC-MS):--.

Column 35, Line 15 Change "(211)," to --(2H),--.

Column 35, Line 25 (Approx.) Change "(1')," to --(b'),--.

Column 35, Line 67 After "was" insert --"l/m=80/20".--.

Column 43, Line 44 (Approx.) Change "glycoluril" to --glycoluril,--.

Column 43, Line 45 (Approx.) Change "D)-1:" to --(D)-1:--.

Column 44, Line 21 (Approx.) Change "(TMA)," to --(TMAH),--.

Column 45, Lines 21-35 (Approx.) In Claim 1, change " 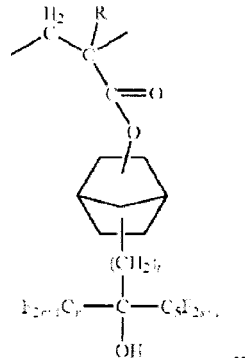 "

to -- 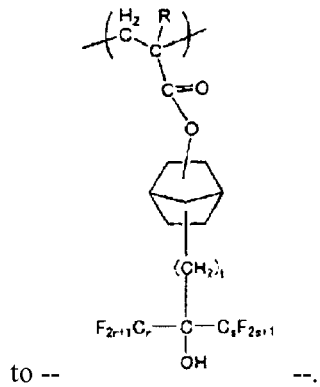 --.